US010522517B2

(12) United States Patent
Tanimoto

(10) Patent No.: US 10,522,517 B2
(45) Date of Patent: Dec. 31, 2019

(54) HALF-BRIDGE POWER SEMICONDUCTOR MODULE AND MANUFACTURING METHOD THEREFOR

(71) Applicant: NISSAN MOTOR CO., LTD., Yokohama-shi, Kanagawa-ken (JP)

(72) Inventor: Satoshi Tanimoto, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/322,765

(22) PCT Filed: May 25, 2015

(86) PCT No.: PCT/JP2015/064869
§ 371 (c)(1),
(2) Date: Dec. 29, 2016

(87) PCT Pub. No.: WO2016/002385
PCT Pub. Date: Jan. 7, 2016

(65) Prior Publication Data
US 2017/0154877 A1 Jun. 1, 2017

(30) Foreign Application Priority Data

Jul. 3, 2014 (JP) .................................. 2014-137589

(51) Int. Cl.
*H01L 23/00* (2006.01)
*H01L 25/07* (2006.01)
(Continued)

(52) U.S. Cl.
CPC ........ *H01L 25/072* (2013.01); *H01L 23/3735* (2013.01); *H01L 24/49* (2013.01);
(Continued)

(58) Field of Classification Search
CPC ......... H01L 23/00; H01L 25/07; H01L 25/18; H01L 24/48; H01L 25/072; H01L 24/49
See application file for complete search history.

(56) References Cited

U.S. PATENT DOCUMENTS 6,212,087 B1    4/2001   Grant et al.
6,343,023 B1 *  1/2002   Wunderlich ...... H02M 3/33576
                                                           363/16
(Continued)

FOREIGN PATENT DOCUMENTS

CN      102067309 A     5/2011
CN      102195458 A     9/2011
(Continued)

OTHER PUBLICATIONS

Title: JP 201333812 A Machine Translation Translated date: Oct. 28, 2018 Publisher: European Patent office Pertinent Page: pp. 18.*
(Continued)

*Primary Examiner* — Joseph C. Nicely
*Assistant Examiner* — Lamont B Koo
(74) *Attorney, Agent, or Firm* — Foley & Lardner LLP

(57) ABSTRACT

A module (1) includes an insulating substrate (15), a power semiconductor device (13HT), a power semiconductor device (13LT), a bridge terminal (14B), a high-side terminal (14H), and a low-side terminal (14L). The bridge terminal extends from a surface wiring conductor (12B) at a position between the power semiconductor devices (13HT, 13LT). The high-side terminal extends from a high-side rear surface wiring conductor (17H) at a position between the power semiconductor devices (13HT, 13LT). The low-side terminal extends from a low-side rear surface wiring conductor (17L) at a position between the power semiconductor devices (13HT, 13LT). A surface electrode of the power semiconductor device (13HT) and a rear electrode of the power
(Continued)

semiconductor device (13LT) are connected to the surface wiring conductor (12B).

10 Claims, 19 Drawing Sheets

(51) Int. Cl.
*H01L 25/18* (2006.01)
*H01L 23/373* (2006.01)
*H01L 23/64* (2006.01)
*H05K 1/02* (2006.01)

(52) U.S. Cl.
CPC .............. *H01L 25/07* (2013.01); *H01L 25/18* (2013.01); *H01L 23/645* (2013.01); *H01L 24/06* (2013.01); *H01L 24/45* (2013.01); *H01L 24/48* (2013.01); *H01L 2224/05552* (2013.01); *H01L 2224/05554* (2013.01); *H01L 2224/0603* (2013.01); *H01L 2224/45014* (2013.01); *H01L 2224/45124* (2013.01); *H01L 2224/45147* (2013.01); *H01L 2224/48091* (2013.01); *H01L 2224/48227* (2013.01); *H01L 2224/48472* (2013.01); *H01L 2224/4903* (2013.01); *H01L 2224/49113* (2013.01); *H01L 2224/49175* (2013.01); *H01L 2224/92247* (2013.01); *H01L 2924/00014* (2013.01); *H01L 2924/13055* (2013.01); *H01L 2924/13091* (2013.01); *H01L 2924/30107* (2013.01); *H05K 1/0209* (2013.01); *H05K 2201/066* (2013.01)

(56) References Cited

U.S. PATENT DOCUMENTS

| | | | |
|---|---|---|---|
| 7,505,294 | B2 | 3/2009 | Ahmed et al. |
| 8,461,623 | B2 | 6/2013 | Nakata |
| 9,000,601 | B2 | 4/2015 | Azuma et al. |
| 9,106,124 | B2 | 8/2015 | Bayerer et al. |
| 2004/0113268 | A1* | 6/2004 | Shirakawa .......... H01L 23/5383 257/724 |
| 2004/0227231 | A1 | 11/2004 | Maly et al. |
| 2004/0228094 | A1 | 11/2004 | Ahmed et al. |
| 2005/0024805 | A1 | 2/2005 | Heilbronner et al. |
| 2007/0076355 | A1 | 4/2007 | Oohama |
| 2009/0015185 | A1 | 1/2009 | Yoshida |
| 2009/0016088 | A1 | 1/2009 | Bayerer et al. |
| 2009/0039498 | A1 | 2/2009 | Bayerer |
| 2009/0085219 | A1 | 4/2009 | Bayerer |
| 2009/0091892 | A1 | 4/2009 | Otsuka et al. |
| 2010/0013085 | A1 | 1/2010 | Oi et al. |
| 2010/0065962 | A1 | 3/2010 | Bayerer et al. |
| 2010/0127371 | A1 | 5/2010 | Tschirbs |
| 2011/0062491 | A1 | 3/2011 | Nakata |
| 2011/0216561 | A1 | 9/2011 | Bayerer et al. |
| 2011/0220979 | A1* | 9/2011 | Kawashima .......... H01L 23/50 257/296 |
| 2012/0106220 | A1 | 5/2012 | Yamaguchi et al. |
| 2013/0001805 | A1 | 1/2013 | Azuma et al. |
| 2013/0043593 | A1 | 2/2013 | Domes |
| 2013/0258628 | A1 | 10/2013 | Kawanami |
| 2013/0286618 | A1 | 10/2013 | Shibasaki et al. |
| 2014/0159225 | A1 | 6/2014 | Zushi et al. |
| 2014/0346676 | A1 | 11/2014 | Horio et al. |
| 2015/0023081 | A1 | 1/2015 | Obiraki et al. |
| 2015/0137344 | A1 | 5/2015 | Mori et al. |
| 2015/0194372 | A1 | 7/2015 | Ikeuchi |
| 2015/0287665 | A1 | 10/2015 | Hanada |
| 2016/0094150 | A1 | 3/2016 | Domurat-Linde et al. |
| 2016/0148859 | A1 | 5/2016 | Muto et al. |
| 2016/0351505 | A1 | 12/2016 | Tamada et al. |
| 2017/0077068 | A1 | 3/2017 | Horio et al. |
| 2017/0154877 | A1 | 6/2017 | Tanimoto |
| 2017/0345792 | A1 | 11/2017 | Tanimoto |

FOREIGN PATENT DOCUMENTS

| | | |
|---|---|---|
| CN | 102856308 A | 1/2013 |
| EP | 0 621 635 A1 | 10/1994 |
| JP | 7-038013 A | 2/1995 |
| JP | 07-022553 U | 4/1995 |
| JP | 2001-102519 A | 4/2001 |
| JP | 2002-033446 A | 1/2002 |
| JP | 2002-112559 A | 4/2002 |
| JP | 2002-373971 A | 12/2002 |
| JP | 2005-192328 A | 7/2005 |
| JP | 2006-086438 A | 3/2006 |
| JP | 2008-306872 A | 12/2008 |
| JP | 2009-071962 A | 4/2009 |
| JP | 2009-159707 A | 7/2009 |
| JP | 2010-205960 A | 9/2010 |
| JP | 2013-033812 A | 2/2013 |
| JP | 2013-089784 A | 5/2013 |
| JP | 2013-219290 A | 10/2013 |
| JP | 2014-038982 A | 2/2014 |
| WO | WO-2012/073570 A1 | 6/2012 |
| WO | WO-2016/129097 A1 | 8/2016 |

OTHER PUBLICATIONS

USPTO Office Action, U.S. Appl. No. 15/527,143 (040302-1146), dated May 15, 2018, 30 pages.

USPTO Office Action, U.S. Appl. No. 15/527,143 (040302-1146), dated Jan. 2, 2019, 27 pages.

USPTO Office Action, U.S. Appl. No. 15/527,143 (040302-1146), dated Apr. 16, 2019, 31 pages.

* cited by examiner

FIG. 1
(a) 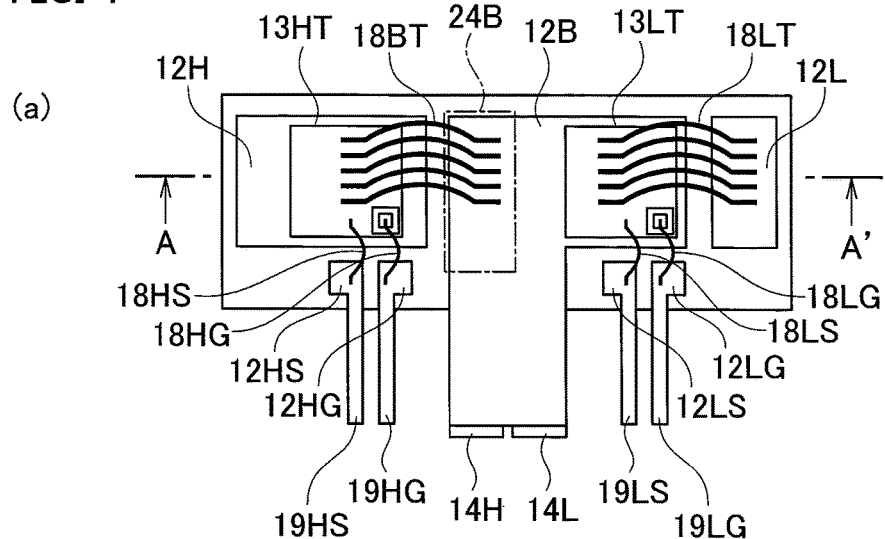
(b) 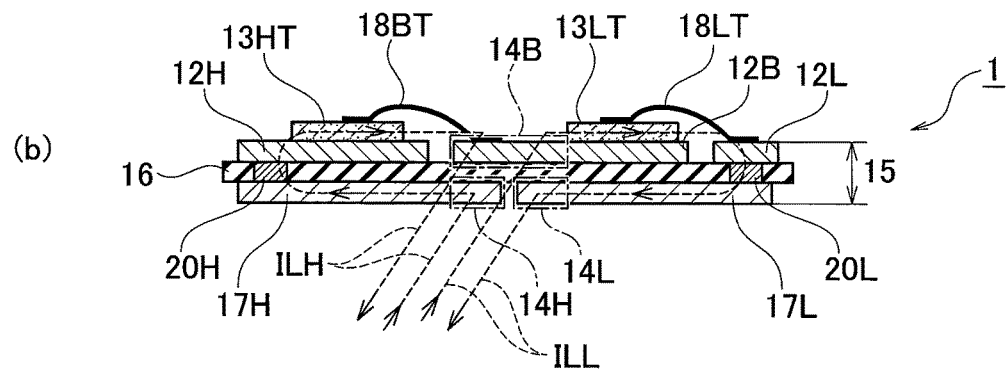
(c) 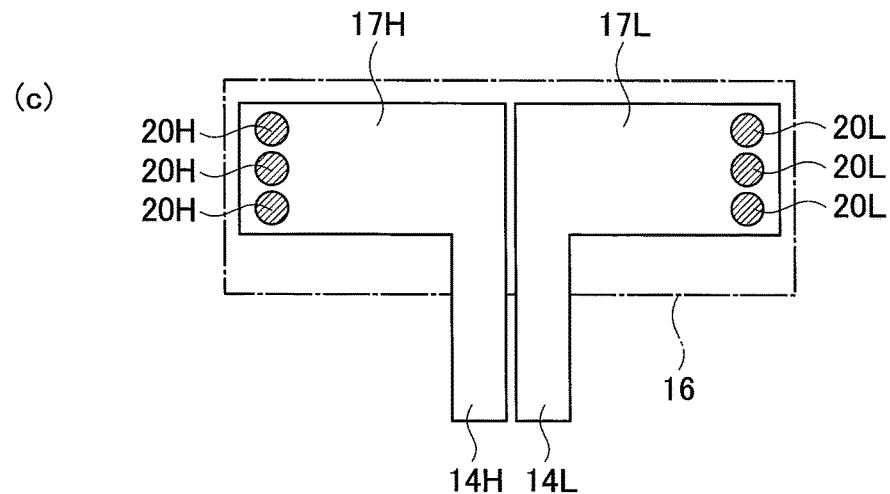

FIG. 2
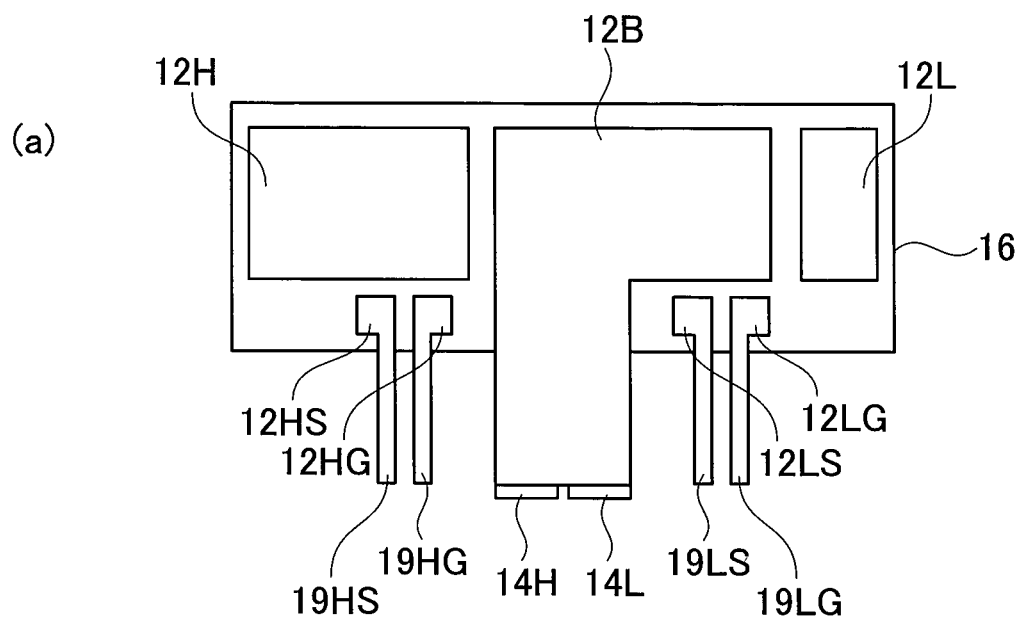
(a)
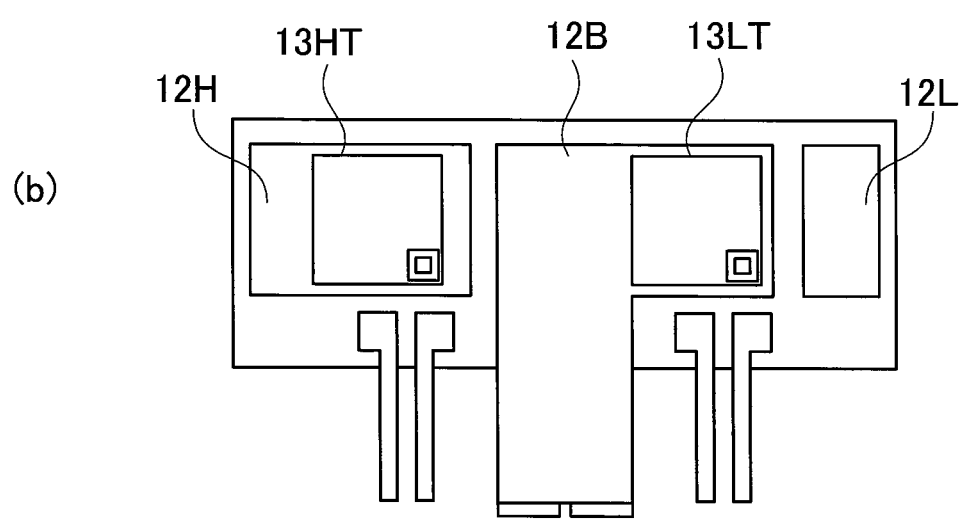
(b)

FIG. 7
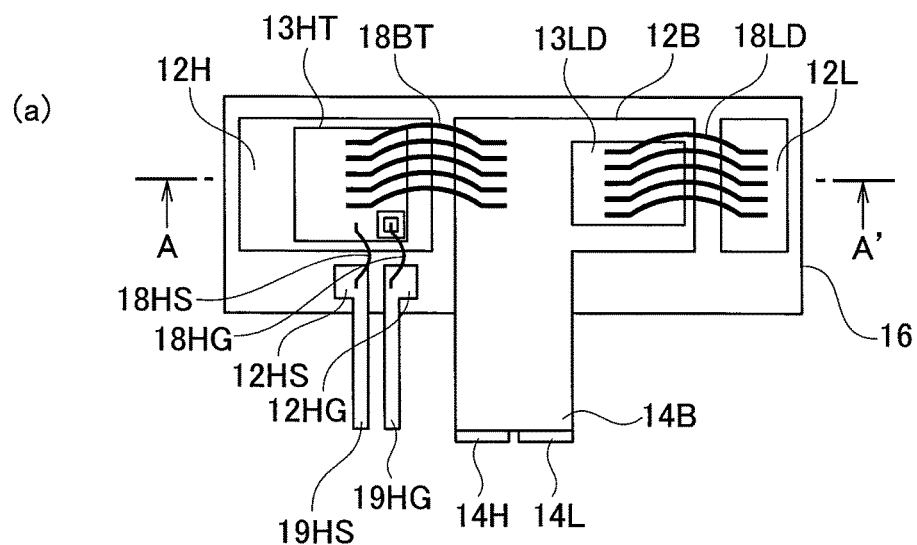
(a)
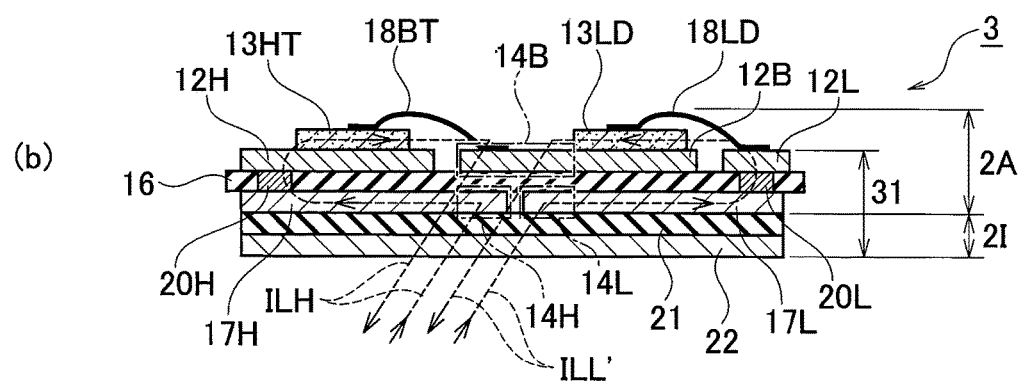
(b)

FIG. 10
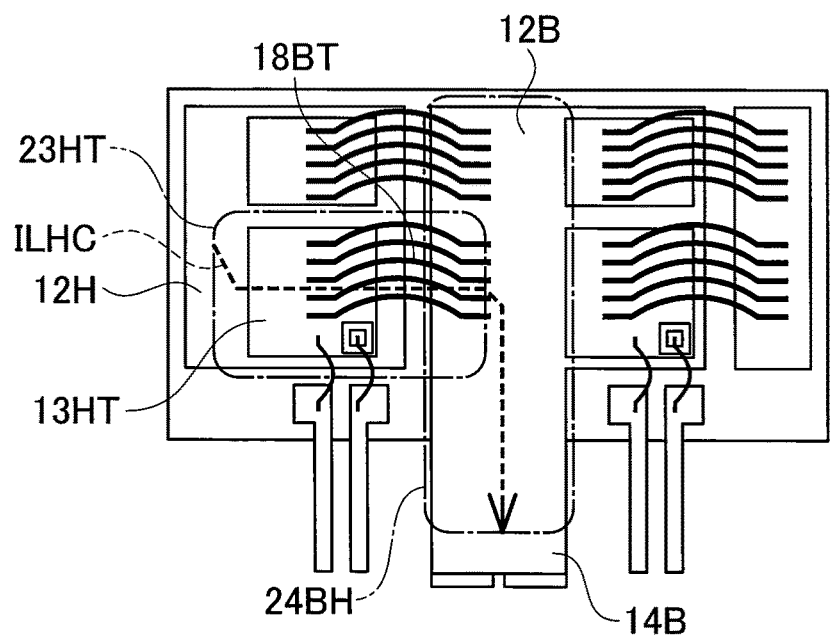
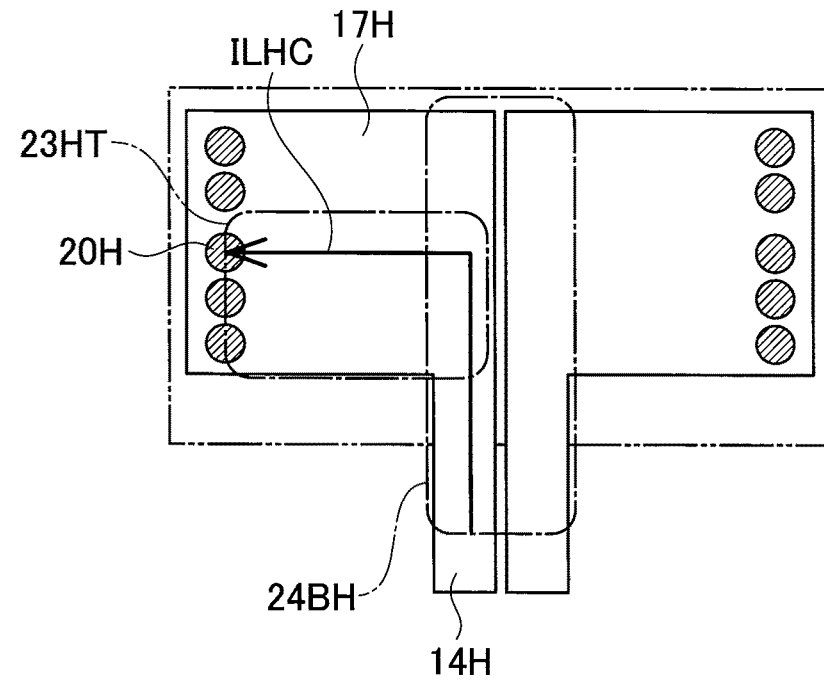

FIG. 11
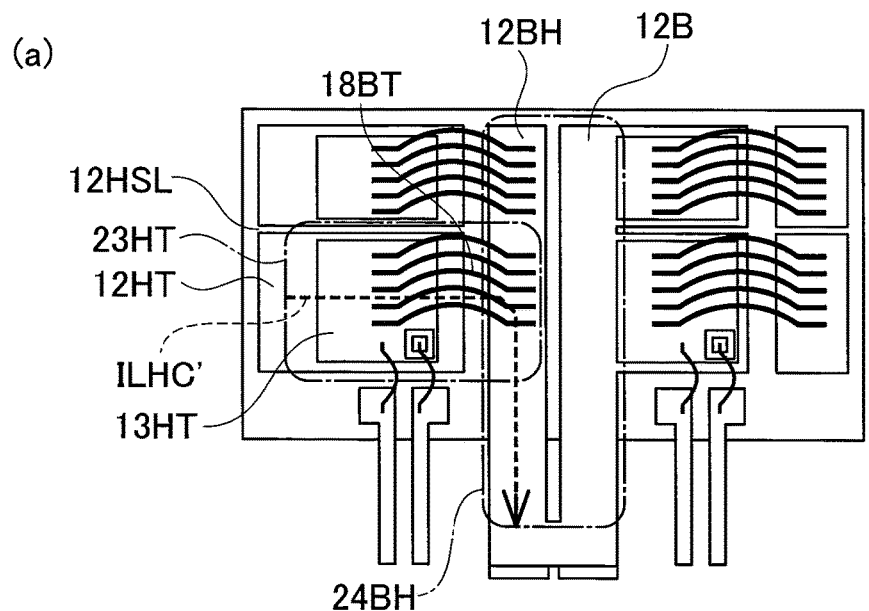
(a)
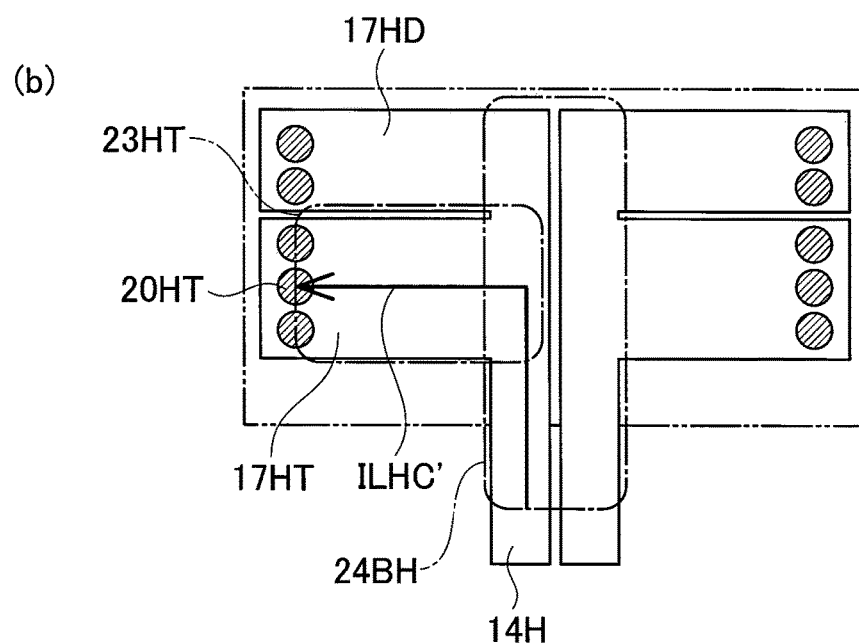
(b)

FIG. 12
(a)
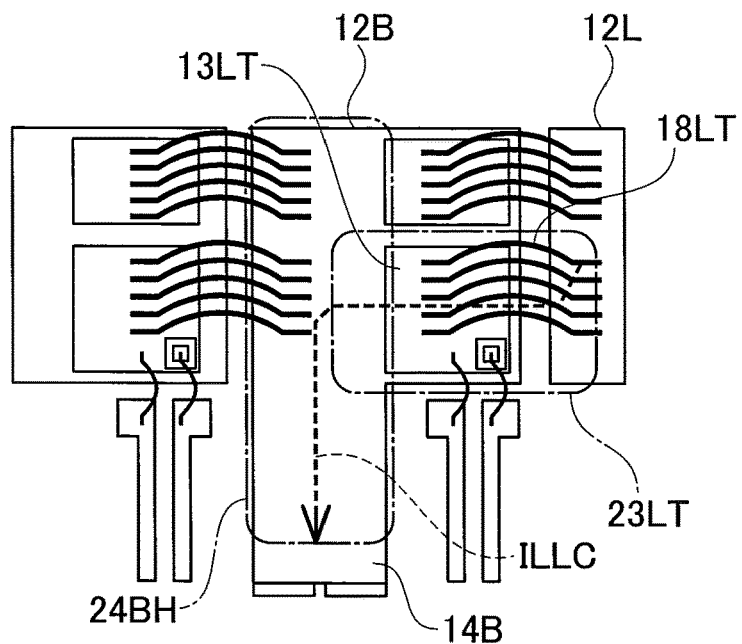
(b)
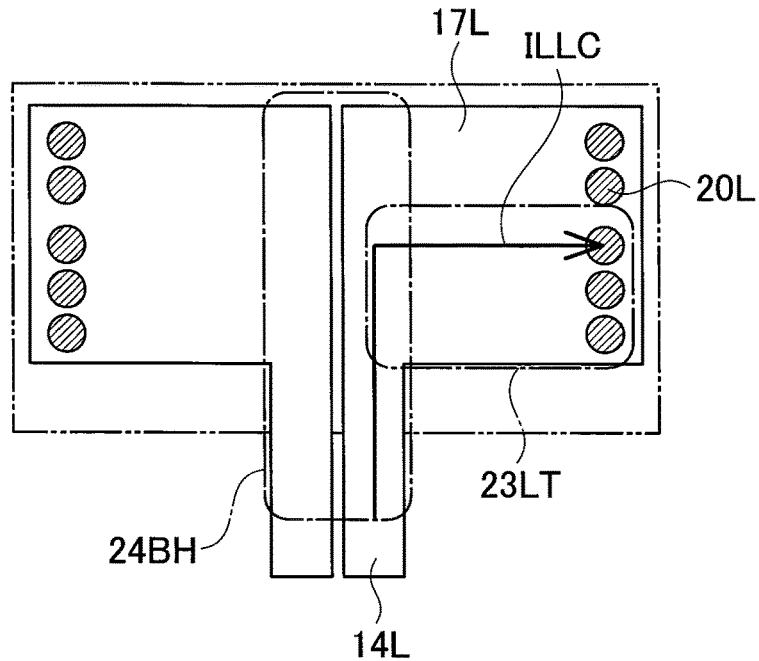

FIG. 13
(a)
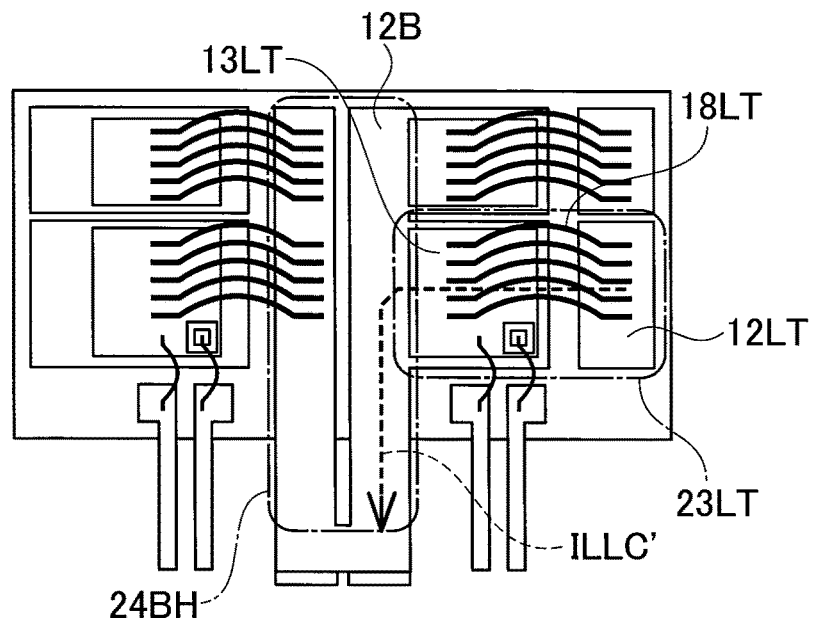
(b)
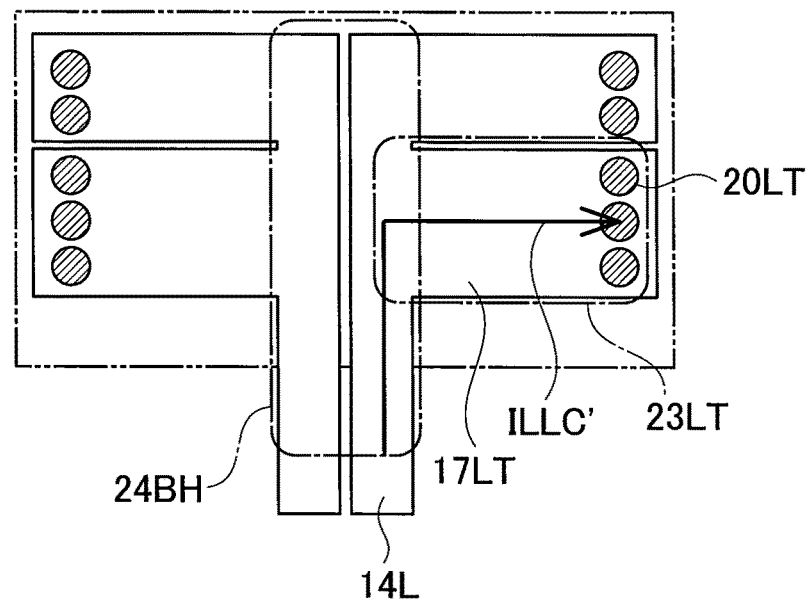

FIG. 14
(a)
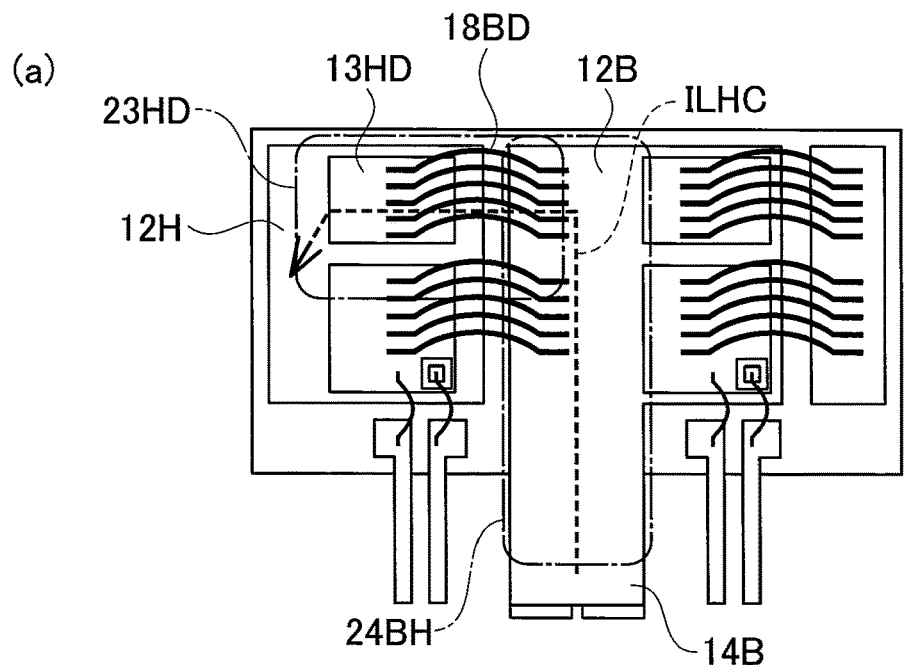
(b)
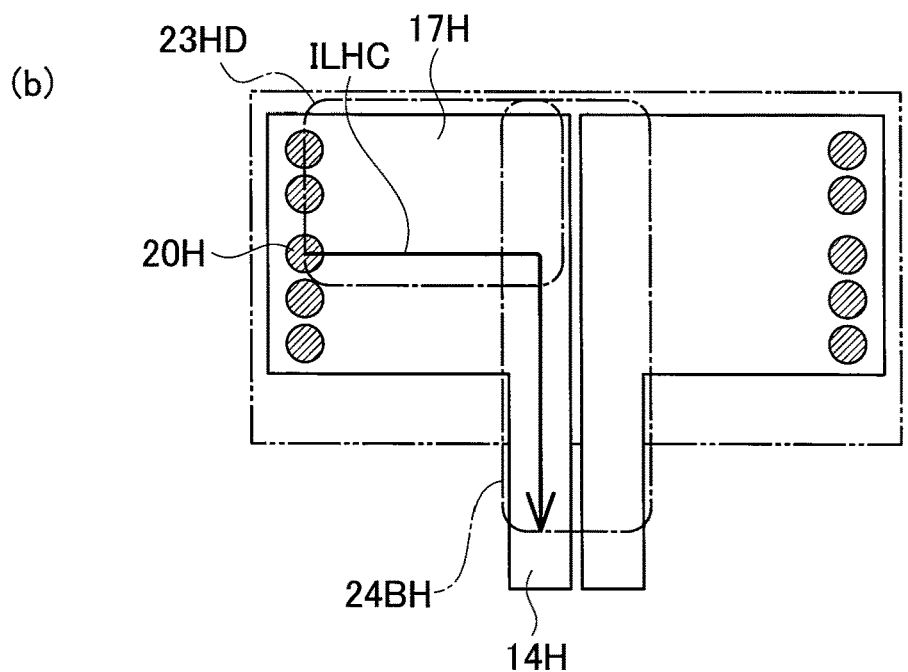

FIG. 15
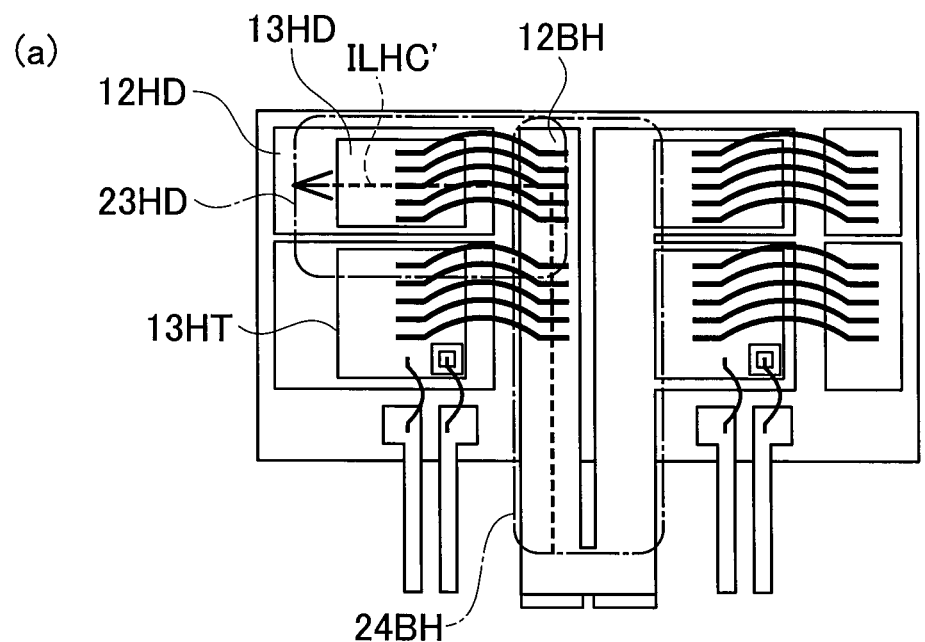
(a)
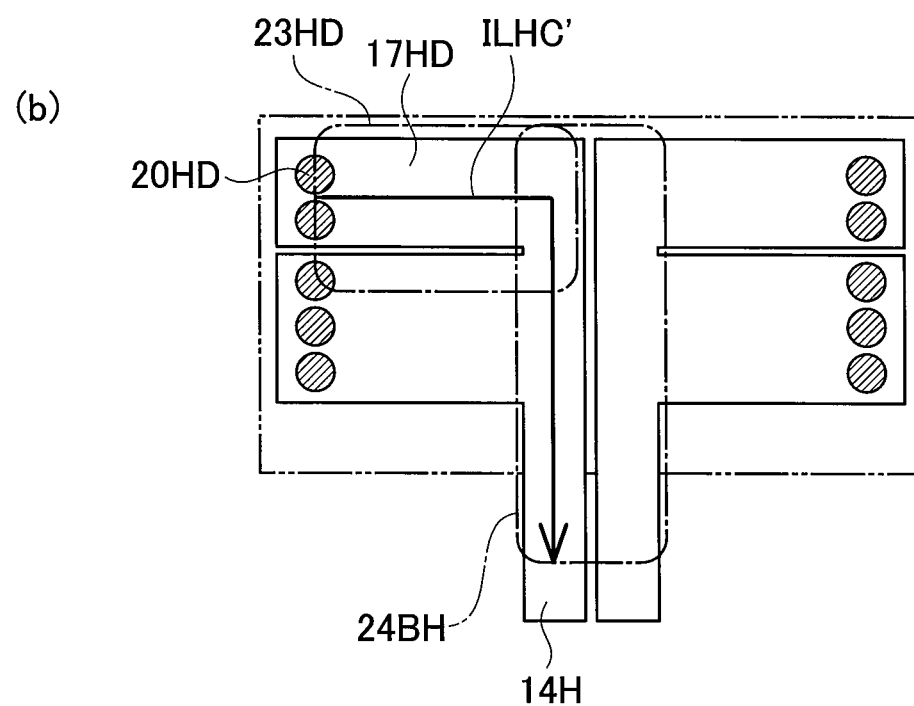
(b)

FIG. 16
(a)
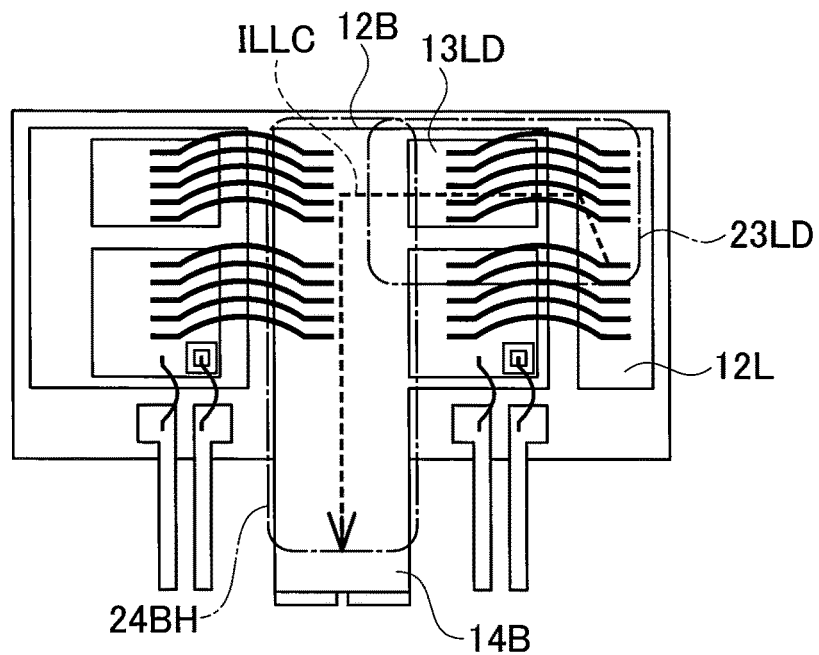
(b)
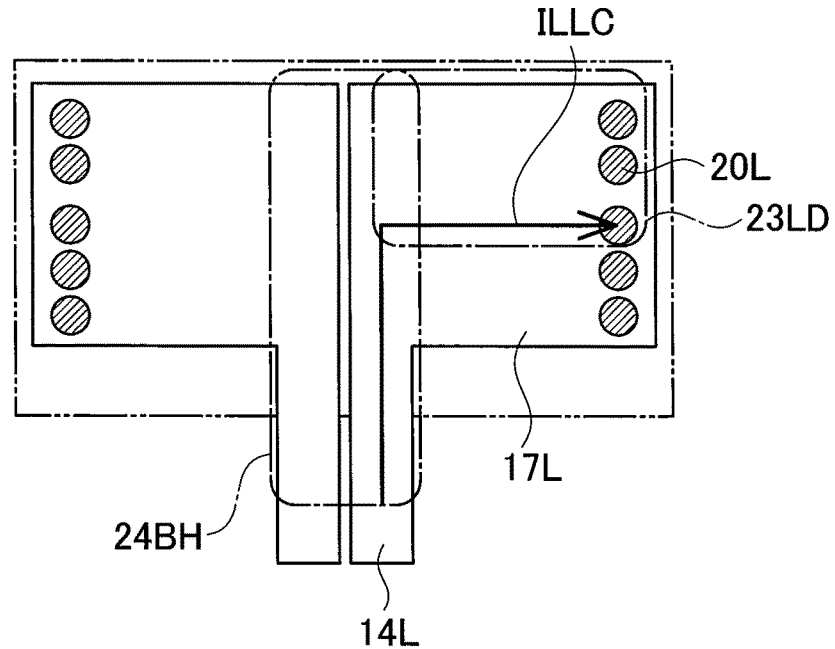

FIG. 17
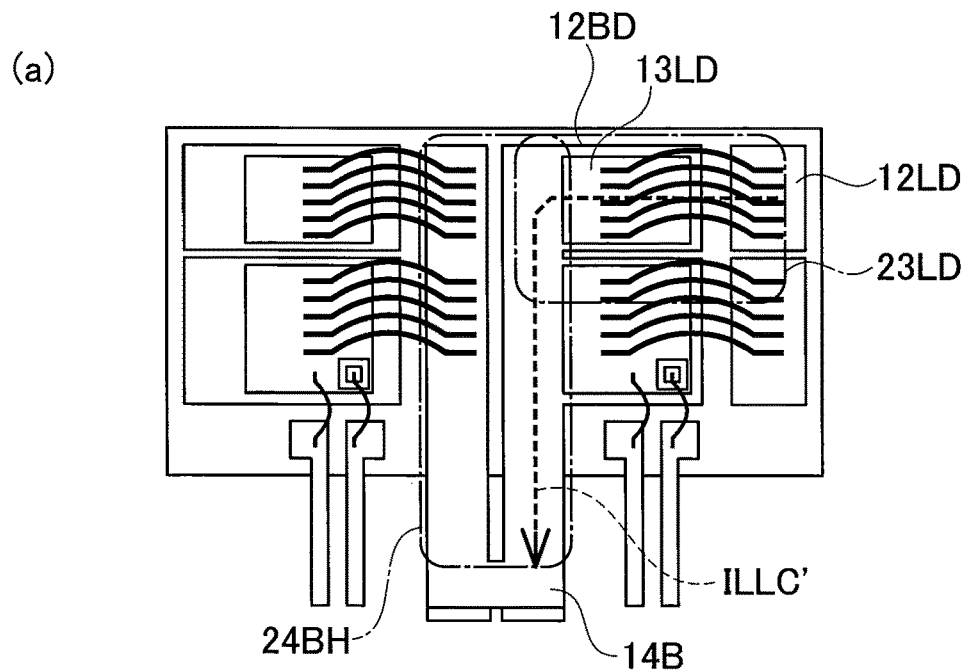
(a)
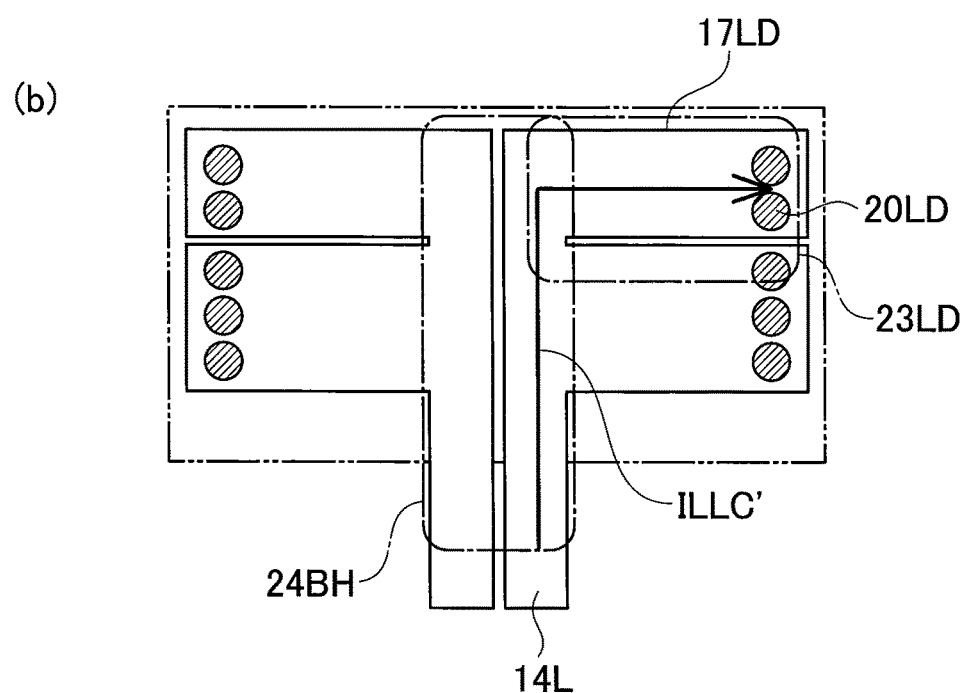
(b)

FIG. 18
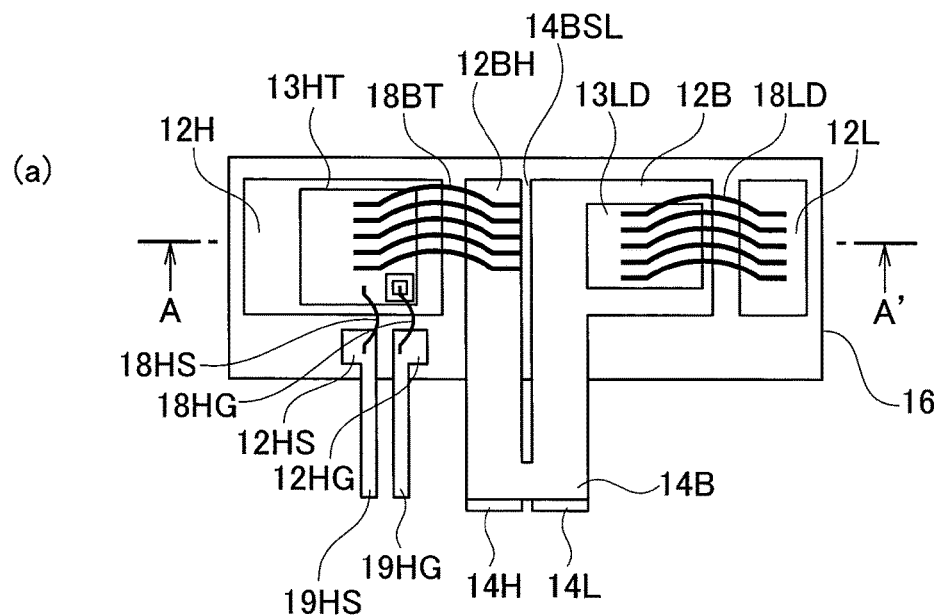
(a)
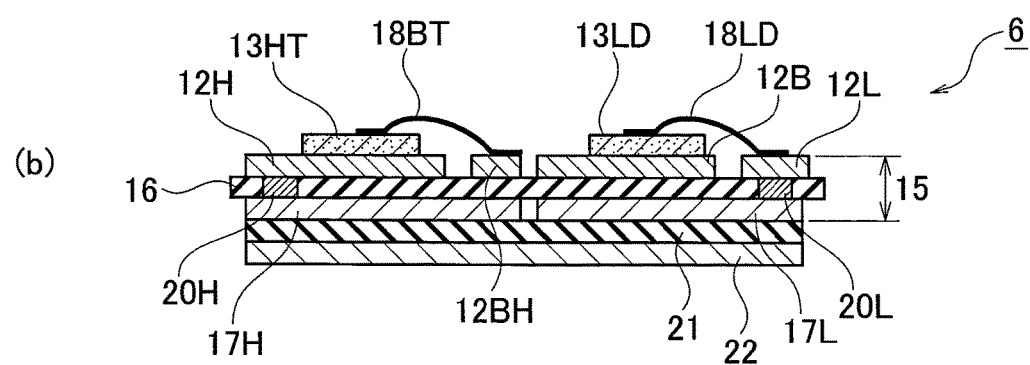
(b)

FIG. 19
(a)
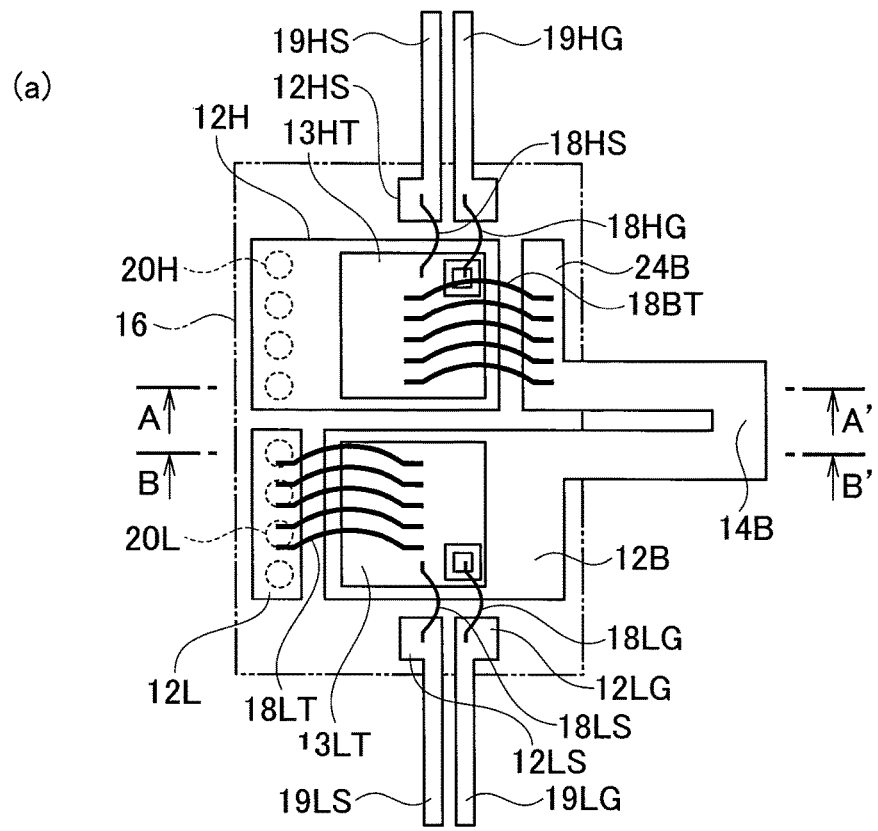
(b)
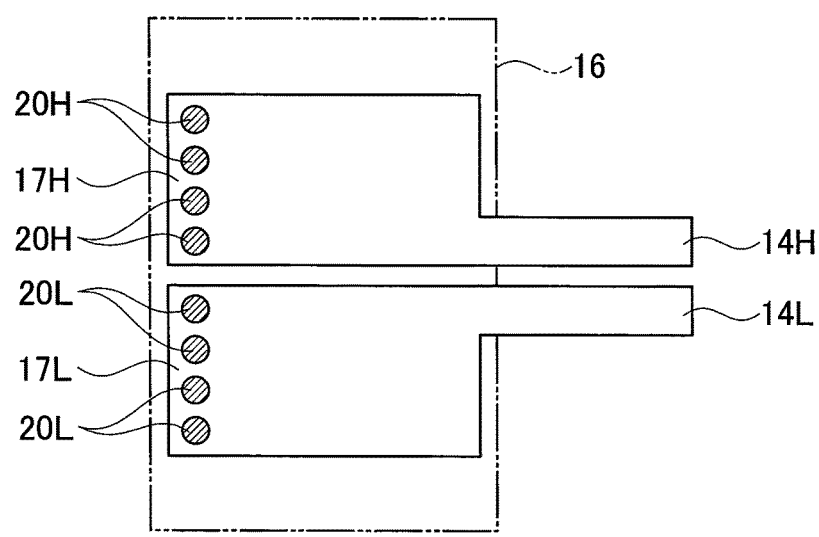

FIG. 20
(a)
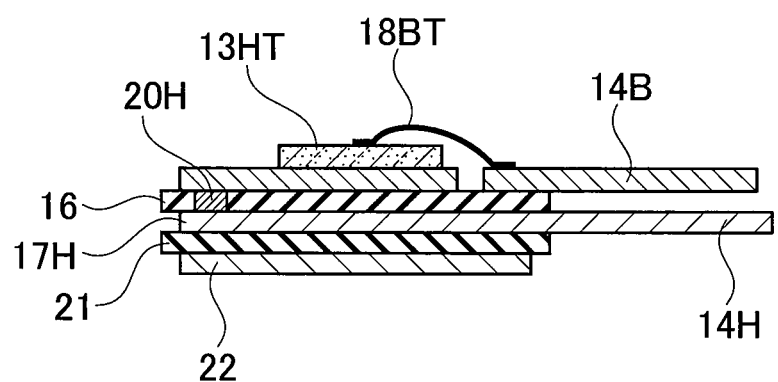
(b)
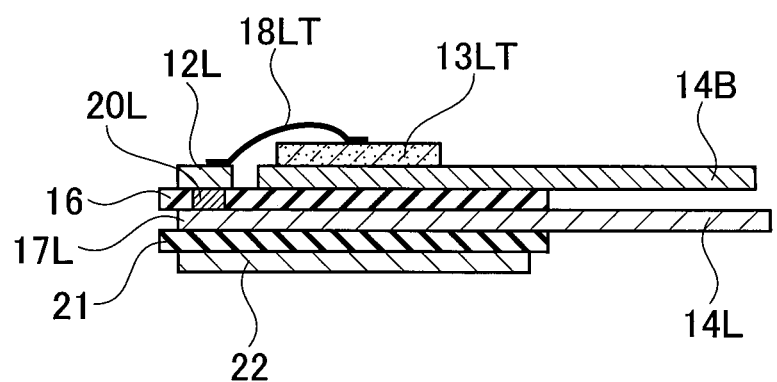

HALF-BRIDGE POWER SEMICONDUCTOR MODULE AND MANUFACTURING METHOD THEREFOR

TECHNICAL FIELD

The present invention relates to a half-bridge power semiconductor module capable of significantly reducing a parasitic inductance generated in an internal main current path and a manufacturing method therefor.

BACKGROUND ART

There is widely known a power module having a half-bridge circuit housed inside one package, the half-bridge circuit having two power semiconductor device chips connected in series and having a connecting midpoint therebetween as an output terminal (see Patent Literatures 1 and 2). In Patent Literature 1 and Patent Literature 2, an electromagnetic method for reducing the parasitic inductance of a wiring by feeding opposite-direction currents through the adjacently arranged reciprocating wirings (hereinafter, referred to as "adjacent antiparallel conduction") is applied in order to reduce a parasitic inductance Ls inside a power module.

CITATION LIST

Patent Literature

Patent Literature 1: Japanese Patent Laid-Open Publication No. 2002-112559
Patent Literature 2: Japanese Patent Laid-Open Publication No. 2002-373971

SUMMARY OF INVENTION

Technical Problem

However, in the structure of the power module of Patent Literature 1 and Patent Literature 2, a section where the adjacent antiparallel conduction of the main current becomes imperfect is inevitably generated. Therefore, there is a problem that a reduction in parasitic inductance cannot be achieved as intended.

The present invention has been made in view of the above-described problem, and it is an object to provide a half-bridge power semiconductor module capable of reducing a parasitic inductance inside a module by improving the adjacent antiparallel conduction of a main current and a manufacturing method therefor.

Solution to Problem

A half-bridge power semiconductor module according to one aspect of the present invention includes an insulating substrate, a high-side power semiconductor device, a low-side power semiconductor device, a bridge terminal, a high-side terminal, and a low-side terminal. The insulating substrate includes an insulating plate, a surface wiring conductor arranged on the surface of the insulating plate, and a high-side rear surface wiring conductor and low-side rear surface wiring conductor arranged on the rear surface of the insulating plate. A rear electrode of the low-side power semiconductor device is ohmically connected to a first surface-wiring conductor. A rear electrode of the high-side power semiconductor device is ohmically connected to a second surface-wiring conductor, and the surface electrode thereof is ohmically connected to the first surface-wiring conductor. The bridge terminal extends from the first surface-wiring conductor at a position between the high-side power semiconductor device and the low-side power semiconductor device. A portion between the second surface-wiring conductor and the high-side rear surface wiring conductor is ohmically connected in a direction opposite to a direction to the low-side power semiconductor device, when seen from the high-side power semiconductor device. A portion between the surface electrode of the low-side power semiconductor device and the low-side rear surface wiring conductor is ohmically connected in a direction opposite to a direction to the high-side power semiconductor device, when seen from the low-side power semiconductor device. The high-side terminal extends from the high-side rear surface wiring conductor at a position between the high-side power semiconductor device and the low-side power semiconductor device. The low-side terminal extends from the low-side rear surface wiring conductor at a position between the high-side power semiconductor device and the low-side power semiconductor device.

BRIEF DESCRIPTION OF DRAWINGS

FIG. 1(a) is a plan view illustrating the structure of a half-bridge power semiconductor module 1 according to a first embodiment, FIG. 1(b) is a cross-sectional view along an A-A' cross-section of FIG. 1(a), and FIG. 1(c) is a virtual front view obtained by omitting an isolating plate 16 and the members on the surface side of the insulating plate 16.

FIG. 2(a) is a plan view illustrating the first step of a manufacturing method for the half-bridge power semiconductor module 1 according to the first embodiment, and FIG. 2(b) is a plan view illustrating the second step of the manufacturing method for the half-bridge power semiconductor module 1 according to the first embodiment.

FIG. 7(a) is a plan view illustrating the configuration of a half-bridge power semiconductor module 3 according to a third embodiment, and FIG. 7(b) is a cross-sectional view along the A-A' cross-section of the FIG. 7(a).

FIG. 10(a) and FIG. 10(b) illustrate a current gravity center line ILHC of a main current that flows when a high-side power semiconductor device (switch) 13HT is turned on, in the fourth embodiment. FIG. 10(a) is a front view and FIG. 10(b) is a virtual front view.

FIG. 11(a) and FIG. 11(b) illustrate a current gravity center line ILHC' of a main current that flows when the high-side power semiconductor device 13HT (switch) is turned on, in a fifth embodiment. FIG. 11(a) is a front view and FIG. 11(b) is a virtual front view.

FIG. 12(a) and FIG. 12(b) illustrate the current gravity center line ILLC of a main current that flows when a low-side power semiconductor device 13LT (switch) is turned on, in the fourth embodiment. FIG. 12(a) is a front view and FIG. 12(b) is a virtual front view.

FIG. 13(a) and FIG. 13(b) illustrate the current gravity center line ILLC' of a main current that flows when the low-side power semiconductor device (switch) 13LT is turned on, in the fifth embodiment. FIG. 13(a) is a front view and FIG. 13(b) is a virtual front view.

FIG. 14(a) and FIG. 14(b) illustrate the current gravity center line (ILHC) of a circulating current flowing through a high-side power semiconductor device 13HD (diode) in the fourth embodiment. FIG. 14(a) is a front view and FIG. 14(b) is a virtual front view.

FIG. 15(a) and FIG. 15(b) illustrate the current gravity center line (ILHC') of a circulating current flowing through the high-side power semiconductor device 13HD (diode) in the fifth embodiment. FIG. 15(a) is a front view and FIG. 15(b) is a virtual front view.

FIG. 16(a) and FIG. 16(b) illustrate the current gravity center line (ILLC) of a circulating current flowing through a low-side power semiconductor device 13LD (diode) in the fourth embodiment. FIG. 16(a) is a front view and FIG. 16(b) is a virtual front view.

FIG. 17(a) and FIG. 17(b) illustrate the current gravity center line (ILLC') of a circulating current flowing through the low-side power semiconductor device 13LD (diode) in the fifth embodiment. FIG. 17(a) is a front view and FIG. 17(b) is a virtual front view.

FIG. 18(a) and FIG. 18(b) illustrate a half-bridge power semiconductor module 6 having a slit 14BSL provided in a surface wiring conductor 12B of the half-bridge power semiconductor module 3 of the third embodiment. FIG. 18(a) is a front view and FIG. 18(b) is the cross-sectional view in the A-A' cross-section.

FIG. 19(a) is a plan view illustrating the configuration of a half-bridge power semiconductor module according to a sixth embodiment, and FIG. 19(b) is a virtual front view obtained by omitting the insulating plate 16 and the members on the surface side of the insulating plate 16.

FIG. 20(a) is a cross-sectional view along the A-A' cross-section of FIG. 19(a), while FIG. 20(b) is a cross-sectional view along the B-B' cross-section of FIG. 19(a).

DESCRIPTION OF EMBODIMENTS

Figure 3:
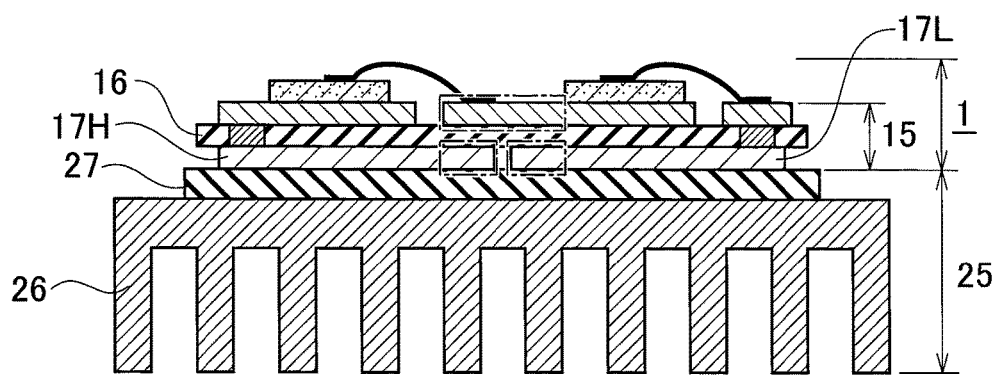
FIG. 3 is a cross-sectional view illustrating a modification in which a radiating member 25 is added to the half-bridge power semiconductor module 1 according to the first embodiment.

Hereinafter, embodiments of the present invention will be described with reference to a plurality of drawings.

However, in the following, the configuration of a power semiconductor module will be described through the use of the schematic views (cross-sectional view, plan view, and the like). Note that, in these schematic views, for ease of understanding, the relationship between a thickness and a plane size, the ratio of the thicknesses of the respective layers, and the like are exaggerated and drawn. The same reference numeral is attached to the same member and the repeated description thereof is omitted.

First Embodiment

[Structure of Half-Bridge Power Semiconductor Module 1]

The structure of a half-bridge power semiconductor module 1 according to a first embodiment will be described with reference to FIG. 1(a), FIG. 1(b), and FIG. 1(c). FIG. 1(a) is a front view and FIG. 1(b) is the cross-sectional view along an A-A' cross-section of the front view. FIG. 1(c) is a virtual front view obtained by omitting an isolating plate 16 and the members on the surface side of the insulating plate 16. In FIG. 1(b), the flow of a main current ILH (load current) when a high-side power semiconductor device 13HT (power switching element) is turned on and the flow of a main current ILL when a low-side power semiconductor device 13LT (power switching element) is turned on are indicated by dashed lines (ILH, ILL) and arrows.

The half-bridge power semiconductor module 1 includes: an insulating substrate 15 with a stacked structure; the high-side power semiconductor device 13HT (switch) and low-side power semiconductor device 13LT (switch) arranged spaced apart from each other on the surface of the insulating substrate 15; a bridge terminal 14B; a high-side terminal 14H; a low-side terminal 14L; a plurality of bonding wires 18BT; and a plurality of bonding wires 18LT.

Note that a bonding ribbon or clip lead can be used other than the bonding wires. Here, as long as the processing constraint, the mechanical strength, and the long-term fatigue resistance are not impaired from the viewpoint of reducing the electric resistance and parasitic inductance as much as possible, the bonding wires 18BT and 18LT are adjusted so that the cross-sectional area increases, the surface area increases, and the ground height decreases, as much as possible.

The insulating substrate 15 includes an insulating plate 16, a plurality of surface wiring conductors (12H, 12L, 12B, 12HG, 12HS, 12LG, 12LS) arranged on the surface of the insulating plate 16, and a tabular high-side rear surface wiring conductor 17H and low-side rear surface wiring conductor 17L arranged on the rear surface of the insulating plate 16.

The plurality of surface wiring conductors includes a surface wiring conductor 12H, a surface wiring conductor 12B as a surface bridge wiring conductor, and a surface wiring conductor 12L as a surface negative electrode wiring conductor.

The insulating plate 16 is formed of, for example, a ceramic plate of SiN, AlN, alumina, or the like. From the viewpoint of reducing the parasitic inductance as much as possible, the thickness of the insulating plate 16 is preferably set to the minimum thickness satisfying the insulating voltage resistance, mechanical strength, and long-term fatigue resistance. For example, in a power semiconductor module requiring an instantaneous voltage resistance of 1.2 kV, the thickness thereof is in a range from 0.2 to 1.5 mm. Specifically, in the case of a SiN plate, the thickness of approximately 0.31 mm is feasible in consideration of the mechanical strength.

The plurality of surface wiring conductors (12H, 12L, 12B, 12HG, 12HS, 12LG, 12LS) has a tabular shape and is directly attached to the surface of the insulating plate 16. For example, the plurality of surface wiring conductors (12H, 12L, 12B, 12HG, 12HS, 12LG, 12LS) is formed of a metal plate of Cu, Al, or the like.

The high-side rear surface wiring conductor 17H and low-side rear surface wiring conductor 17L are directly attached to the rear surface of the insulating plate 16. For example, the high-side rear surface wiring conductor 17H and low-side rear surface wiring conductor 17L are formed of a metal plate of Cu, Al, or the like.

The bonding wire 18BT and surface wiring conductor 12B have a role as a bridge wiring.

The insulating substrate 15 further includes connection conductors (20H, 20L) embedded into a plurality of opening windows provided in the insulating plate 16. Each of the connection conductors (20H, 20L) has a flat cylindrical shape.

The connection conductor 20H is positioned on one side (on the left side in the view) in the longitudinal direction of the insulating plate 16. The connection conductor 20H connects the surface wiring conductor 12H (first surface-wiring conductor) selected from among the plurality of surface wiring conductors and the high-side rear surface wiring conductors 17H.

The connection conductor 20L is positioned on the other side (on the right side in the view) in the longitudinal direction of the insulating plate 16. The connection conductor 20L connects the surface wiring conductor 12L selected from among the plurality of surface wiring conductors and the low-side rear surface wiring conductors 17L.

The low-side power semiconductor device 13LT has the rear electrode thereof connected onto the surface wiring conductor 12B (second surface-wiring conductor) selected from among the plurality of surface wiring conductors. Specifically, a surface electrode (a source or emitter electrode) is formed on the surface of the low-side power semiconductor device 13LT, and a rear electrode (a drain or collector electrode) is formed on the rear surface thereof.

The rear electrode of the low-side power semiconductor device 13LT is die-bonded to the other side (right side) of the surface wiring conductor 12B through the use of solder or the like. The surface electrode of the low-side power semiconductor device 13LT is connected to the surface wiring conductor 12L via the plurality of bonding wires 18LT.

The high-side power semiconductor device 13HT has the rear electrode connected onto the surface wiring conductor 12H. Specifically, the surface electrode (a source or emitter electrode) is formed on the surface of the high-side power semiconductor device 13HT, and the rear electrode (a drain or collector electrode) is formed on the rear surface thereof.

The rear electrode of the high-side power semiconductor device 13HT is die-bonded to the other side (right side) of the surface wiring conductor 12H with solder or the like. The surface electrode of the high-side power semiconductor device 13HT is connected to the surface wiring conductor 12B via the plurality of bonding wires 18BT. The plurality of bonding wires 18BT is connected to a bridge connection region 24B on one side (left side) of the surface wiring conductor 12B.

The plurality of bonding wires 18LT, the surface wiring conductor 12L, and the connection conductor 20L correspond to the "second connection portion". The plurality of bonding wires 18LT, the surface wiring conductor 12L, and the connection conductor 20L are provided toward the orientation opposite to the orientation toward the high-side power semiconductor device 13HT, when seen from the low-side power semiconductor device 13LT, and connect the surface electrode of the low-side power semiconductor device 13LT and the low-side rear surface wiring conductors 17L.

The connection conductor 20H corresponds to the "first connection portion". The connection conductor 20H is provided toward the orientation opposite to the orientation toward the low-side power semiconductor device 13LT, when seen from the high-side power semiconductor device 13HT, and connects the surface wiring conductor 12H (first surface-wiring conductor) and the high-side rear surface wiring conductor 17H.

A slit 14BSL is a terminal extending from the surface wiring conductor 12B at a position between the high-side power semiconductor device 13HT and the low-side power semiconductor device 13LT. Specifically, the bridge terminal 14B is formed by being extended from the first surface-wiring conductor to the direction parallel to the surface of the insulating substrate 15.

The high-side terminal 14H is formed by extending the high-side rear surface wiring conductor 17H from the long side of the insulating substrate 15 toward the outside, at a position between the high-side power semiconductor device 13HT and the low-side power semiconductor device 13LT. The high-side terminal 14H extends so as to overlap with the bridge terminal 14B toward the same orientation as the bridge terminal 14B, when seen from the normal direction of the insulating substrate 15.

The low-side terminal 14L is formed by extending the low-side rear surface wiring conductor 17L from the long side of the insulating substrate 15 toward the outside, at a position between the high-side power semiconductor device 13HT and the low-side power semiconductor device 13LT. The low-side terminal 14L extends so as to overlap with the bridge terminal 14B toward the same orientation as the bridge terminal 14B, when seen from the normal direction of the insulating substrate 15.

The high-side terminal 14H and the low-side terminal 14L are arranged close to each other as long as the design rules about the discharge prevention and/or the manufacturing method allow. An insulation sheet is preferably disposed between the bridge terminal 14B, high-side terminal 14H, and low-side terminal 14L, both for discharge prevention and for contact prevention.

In the first embodiment, each of the high-side power semiconductor device 13HT and the low-side power semiconductor device 13LT is a power switching element, and has a gate electrode that inputs a control signal for switching between a state (on-state) where the surface electrode is conducted to the rear electrode and a state (off-state) where the surface electrode is isolated from the rear electrode.

The gate electrode and surface electrode of the high-side power semiconductor device 13HT are connected to the surface wiring conductor 12HG or 12HS via the bonding wire 18HG or 18HS, respectively. The gate electrode and surface electrode of the low-side power semiconductor device 13LT are connected to the surface wiring conductor 12LG or 12LS via a bonding wire 18LG or 18LS, respectively.

Parts of the surface wiring conductors 12HG and 12HS are extended, in the shape of a strip and adjacently parallel to each other, toward the outside of the insulating substrate 15, thereby forming a gate signal terminal 19HG or a source signal terminal 19HS.

Parts of the surface wiring conductors 12LG and 12LS are extended, in the shape of a strip and adjacently parallel to each other, toward the outside of the insulating substrate 15, thereby forming a gate signal terminal 19LG or a source signal terminal 19LS.

Note that, in the embodiment, it is assumed that the high-side power semiconductor device 13HT and the low-side power semiconductor device 13LT are controlled so as to be exclusively turned on. It is possible to simultaneously turn on (ground) the high-side power semiconductor device 13HT and the low-side power semiconductor device 13LT.

The bridge terminal 14B, high-side terminal 14H, low-side terminal 14L, gate signal terminals (19HG, 19LG), and source signal terminals (19HS, 19LS) are formed by extending each of the surface wiring conductor and rear surface wiring conductor. Accordingly, each terminal is integral to each of the surface wiring conductor and rear surface wiring conductor, and of course, the material thereof is the same as the surface wiring conductor or the rear surface wiring conductor. The material of the bonding wires (18BT, 18LT, 18HG, 18HS, 18LG, 18LS) is Al, Cu, an alloy thereof, or the like.

[Manufacturing Method for Half-Bridge Power Semiconductor Module 1]

Next, there will be described an example of the manufacturing method for the half-bridge power semiconductor module 1 according to the first embodiment through the use of FIG. 2(a) and FIG. 2(b).

In the first step, as illustrated in FIG. 2(a), there is prepared the insulating substrate 15 which includes the insulating plate 16, each of the surface wiring conductors (12H, 12L, 12B, 12HG 12HS, 12LG 12LS), the rear surface wiring conductors (17H, 17L: not-illustrated), each of the terminals (14B, 19HG, 19HS, 19LG, 19LS, 14H, 14L) formed by horizontally extending each of the wiring conductors (12B, 12HG, 12HS, 12LG, 12LS, 17H, 17L), and the connection conductors (20H, 20L: not-illustrated). At least the surface of the insulating substrate 15 is sufficiently rinsed with an organic solvent such as acetone or ethanol. Note that, since the production method for the insulating substrate 15 of the half-bridge power semiconductor module 1 according to the first embodiment is already known, the description thereof is omitted.

In the second step, as illustrated in FIG. 2(b), the front surfaces and rear surfaces of the high-side power semiconductor device 13HT and low-side power semiconductor device 13LT each including an individual semiconductor chip are sufficiently rinsed with an organic solvent such as acetone or ethanol. Subsequently, through the use of a soldering and reflow apparatus, the rear electrode of each of the power semiconductor devices (13HT, 13LT) is die-bonded at a predetermined position of each of the surface wiring conductors (12H, 12B) of the insulating substrate 15. At this time, it is desirable to use a carbon positioning jig in order to accurately performing the positioning of each of the power semiconductor devices (13HT, 13LT).

In the third step, after the die bonding is completed, through the use of a wedge bonding apparatus, the surface electrode and gate electrode of each of the power semiconductor devices (13HT, 13LT) and each of the surface wiring conductors (12B, 12HG, 12HS, 12L, 12LG, 12LS) are connected with the bonding wires (18BT, 18HG, 18HS, 18LT, 18LG, 18LS). In this way, the half-bridge power semiconductor module 1 according to the first embodiment is completed.

[Modification (Radiating Member 25)]

With reference to FIG. 3, a modification will be described in which a radiating member 25 is added to the half-bridge power semiconductor module 1 according to the first embodiment. The radiating member 25 thermally makes contact with the rear surface of the insulating substrate 15 to thereby radiate the Joule's heat generated in each of the power semiconductor devices (13HT, 13LT). The radiating member 25 includes: an insulating sheet 27 which is caused to adhere to the rear surfaces of the high-side rear surface wiring conductor 17H and low-side rear surface wiring conductor 17L with a thermally conductive adhesive (not-illustrated); and a heat sink 26 (or radiating plate) caused to adhere to the insulating sheet 27 with a thermally conductive adhesive (not-illustrated). When the heat sink 26 (or radiating plate) is constituted of a conductive material, such as metal, the insulating sheet 27 formed of an insulator is attached to a heat transfer surface (upper surface) of the heat sink 26 (or radiating plate).

Comparative Example

Next, with reference to a comparative example illustrated in FIG. 21, the operations and effects obtained from the half-bridge power semiconductor module 1 according to the first embodiment will be described.

Due to the emergence of the power semiconductor devices (MOSFET, JFET, SBD, and the like) using wide band gap semiconductors of silicon carbide (SiC) and/or gallium nitride (GaN), and due to the emergence of the power Si-MOSFET of a super junction structure, there have been actively developed, in recent years, next-generation power converters (inverters or converters) driven by being switched at high speed in a high-voltage region from 600 V to 1.8 kV. This is because the capability of being switched at high speed naturally implies that these power semiconductor devices unipolarly operate at high voltage. A first benefit from the high-speed switching drive is an increase in the conversion efficiency of a power semiconductor device by reducing the switching loss of the power semiconductor device. However, a second benefit that the switching frequency (or carrier frequency) can be increased by the amount of the reduction of the switching loss without reduction in the conversion efficiency is more important in practical use. This is because the volume of a large-size passive component such as a coupling capacitor or reactor becomes decreased if the switching frequency is increased, resulting in a reduction of the size and/or price of the power converter.

A circuit having two power semiconductor device chips connected in series and having the connecting midpoint thereof used as the output terminal is referred to as a half-bridge (power) circuit. A power module having one or more half-bridge circuits housed inside one package is widely used as the main circuit of a power converter controlling a large inductive load. When the power semiconductor device of this power module is replaced with a power semiconductor device using the above-described semiconductor with a wide band gap and the replaced power semiconductor device is caused to switch at high speed, the following problems (1) to (3) may be generated.

(1) At the moment a turned-on power semiconductor device is turned off, a large surge voltage (or kick-back voltage) is generated to thereby increase the switching loss.

(2) In the worst case, this surge voltage destroys the power semiconductor device.

(3) When adopting a power semiconductor device of higher-breakdown voltage specification in order to escape this threat, the conduction loss increases and the manufacturing cost also increases.

The causes of the above-described problems are a parasitic inductance Ls (self-inductance) produced in the module wiring path through which the main current (load current) flows and a reverse electromotive voltage (=−Ls×di/dt) caused by a rapid current change (di/dt). Note that, although the parasitic inductance of a power module external circuit is also a cause of the above-described problem, a practical countermeasure technique already exists, and thus, here it is assumed that the countermeasure against the parasitic inductance of a power module external circuit has been naturally already taken. Furthermore, the module using an Si-IGBT performing a bipolar operation and having a relatively fast switching speed is also recently evolving toward higher-current control. Accordingly, the numerator (di) of the current change rate (di/dt) increases, and as the result, the above-described problem is about to be revived also in the Si-IGBT module.

As the method for reducing the parasitic inductance of a wiring, there is an electromagnetic method for diminishing the parasitic inductance of a wiring by the use of a mutual conductance effect caused by causing the opposite-direction currents to flow through the adjacently arranged reciprocating wirings (see Patent Literature 1 and Patent Literature 2). Namely, there is provided a parallel wiring plate having the same potential as either a high-side potential or low-side potential on the rear surface of an insulating substrate having a bridge circuit formed on the surface. The "adjacent antiparallel conduction" is formed by causing a main current in a direction opposite to the main current on the surface to flow through the parallel wiring plate.

Figure 21:
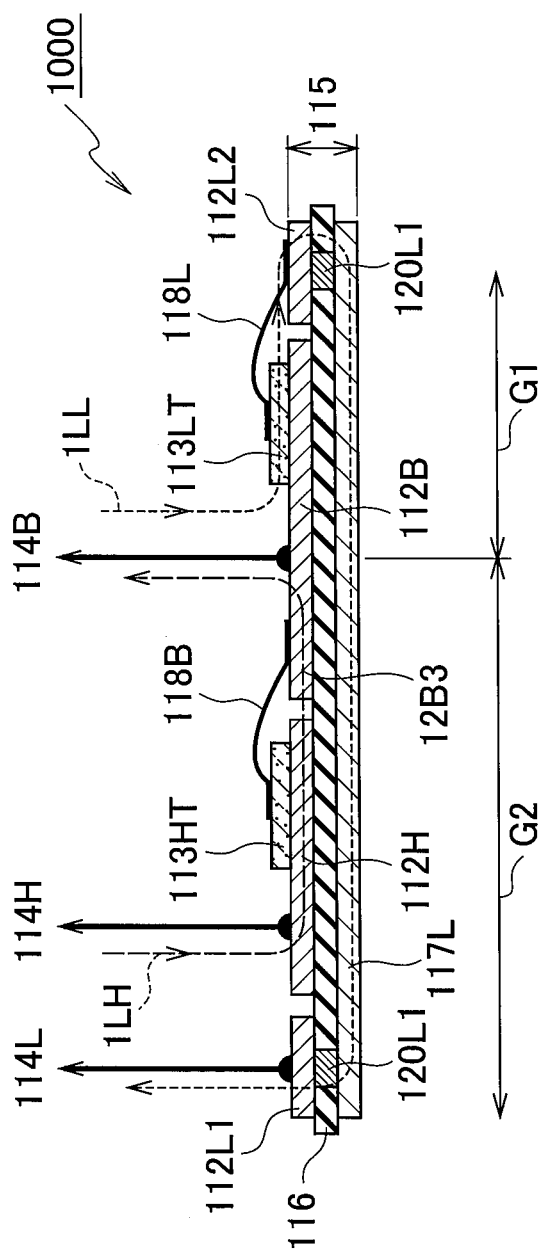
FIG. 21 is a cross-sectional view illustrating the structure of a half-bridge power module 1000 according to a comparative example.

FIG. 21 illustrates a comparative example, in which this electromagnetic method is applied for reduction of the parasitic inductance inside a half-bridge power module 1000. In the half-bridge power module 1000, an insulating substrate 115 includes an insulating plate 116, surface conductors (112H, 112B, 112L1, 112L2) and a rear conductor 117L are formed on the surface and rear surface of the insulating plate 116, and each of connection conductors (120L1, 120L2) is embedded into an opening penetrating the insulating plate 116. The connection conductor 120L1 connects the rear conductor 117L with the surface conductor 112L1, while the connection conductor 120L2 connects the rear conductor 117L with the surface conductor 112L2.

The surface conductor 112H is provided with a high-side terminal 114H, the surface conductor 112L2 is provided with a low-side terminal 114L, and the surface conductor 112B is provided with a bridge terminal 114B.

A high-side power semiconductor device 113HT (switching element) is arranged on the surface conductor 112H, while a low-side power semiconductor device 113LT (switching element) is arranged on the surface conductor 112B. The rear electrode of each of the power semiconductor devices (113HT, 113LT) is die-bonded to the surface conductor 112H or surface conductor 112B. The surface electrode of the high-side power semiconductor device 113HT is connected to the surface conductor 112B via a bonding wire 118B. The surface electrode of the low-side power semiconductor device 113LT is connected to the surface conductor 112L2 via a bonding wire 118L.

However, in the structure of the power module of FIG. 21, a section where the "adjacent antiparallel conduction" of the main current becomes imperfect is inevitably produced. Accordingly, there is a problem that the reduction of the parasitic inductance Ls cannot be achieved as intended. The detail will be described below.

A dashed line ILL and an arrow of FIG. 21 indicate the flow of the main current (load current) when the low-side power semiconductor device 113LT is turned on. The main current (ILL) is input to the power module from the bridge terminal 114B, and is output from the low-side terminal 114L through the surface conductor 112B, the low-side power semiconductor device 113LT, the bonding wire 118L, the surface conductor 112L2, the connection conductor 120L2, the rear conductor 117L, the connection conductor 120L1, and the surface conductor 112L1. Here, in a first section G1 of FIG. 21, the direction of the main current (ILL) flowing on the surface side of the insulating substrate 115 and the direction of the main current (ILL) flowing on the rear surface side become opposite. Accordingly, the reduced parasitic inductance Ls can be realized by the "adjacent antiparallel conduction" effect of the main current. However, in a second section G2 adjacent to the first section G1, the main current (ILL) flows only through the rear conductor 117L. Therefore, the increased parasitic inductance Ls is produced in the second section G2 because there is no "adjacent antiparallel conduction" effect of the main current. As the result, a large surge is generated when the low-side semiconductor device 113LT is turned off.

The dashed line ILH and arrow of FIG. 21 indicate the flow of the main current (load current) when the high-side power semiconductor device 113HT is turned on. The main current (ILH) is input to the power module from the high-side terminal 114H, and is output from the bridge terminal 114B through the surface conductor 112H, the high-side power semiconductor device 113HT, the bonding wire 118B, and the surface conductor 112B. It should be noted here that the main current (ILH) does not flow through the rear conductor 117L at all and thus there is no "adjacent antiparallel conduction" effect. That is, when the high-side semiconductor device 113H is turned on, the current paths (114H, 112H, 113HT, 118B, 112B, 114B) of the main current (ILH) are brought into a state of the increased parasitic inductance Ls. Accordingly, the moment the high-side semiconductor device 113HT is rapidly turned off, a large surge voltage is generated and is applied to the high-side semiconductor device 113HT.

[Working Effect by First Embodiment]

According to the embodiment, the "adjacent antiparallel conduction" effect of the main current can be enhanced. That is, it is possible to reduce the parasitic inductance Ls inside the module to an ideal level and thus to further suppress the generation of the surge voltage.

The effect of the half-bridge power semiconductor module 1 according to the first embodiment will be described in detail with reference to FIG. 1(a), FIG. 1(b), and FIG. 1(c).

The main current (ILL) flowing through the low-side power semiconductor device 13LT is input to the module from the bridge terminal 14B on the surface, and is output to the outside of the module from the low-side terminal 14L on the rear surface through the surface wiring conductor 12B, the low-side power semiconductor device 13LT, the bonding wire 18LT, the surface wiring conductor 12L, the connection conductor 20L, and the low-side rear surface wiring conductor 17L. As described above, when the low-side power semiconductor device 13L is turned on, the main current (ILL) having the same magnitude and opposite direction can be fed on the surface side and rear surface side of the insulating substrate 15, respectively, at substantially all the places (including also the bridge terminal 14B and low-side terminal 14L) through which the main current ILL (load current) flows. Accordingly, the "adjacent antiparallel conduction" effect of the main current (ILL) can be obtained in the whole region, and thus the parasitic inductance Ls, which is produced in a current channel when the low-side power semiconductor device 13LT is turned on, can be ideally reduced.

On the other hand, the main current (ILH) flowing through the high-side power semiconductor device 13HT is input to the module from the high-side terminal 14H of the rear surface, and is output to the outside of the module from the bridge terminal 14B on the surface through the high-side rear surface wiring conductor 17H, the connection conductor 20H, the surface wiring conductor 12H, the high-side power semiconductor device 13HT, the bonding wire 18BT, and the bridge connection region 24B of the surface wiring conductor 12B. As described above, when the high-side power semiconductor device 13HT is also turned on, the main current (ILH) having the same magnitude and opposite direction can be fed on the surface side and rear surface side of the insulating substrate 15, respectively, at substantially all the places (including also the bridge terminal 14B and low-side terminal 14L) through which the main current ILH (load current) flows. Accordingly, the "adjacent antiparallel conduction" effect of the main current (ILH) can be obtained in the whole region, and thus the parasitic inductance Ls, which is produced in a current channel when the high-side power semiconductor device 13HT is turned on, can be ideally reduced.

Moreover, in the first embodiment, there is no second section G2, in which the main currents (ILL, ILH) flow only in one of the directions in the comparative example of FIG. 21. Therefore, the half-bridge power semiconductor module 1 can reduce at least the whole parasitic-inductance Ls produced in the second section G2 of FIG. 21. Accordingly, there can be reduced the surge voltage generated when the low-side power semiconductor device 13LT and high-side power semiconductor device 13HT are turned on.

As described above, in the half-bridge power semiconductor module 1, when either the high-side power semiconductor device 13HT or the low-side power semiconductor device 13LT is turned on, there can be formed a state where the reversed main currents flow through the conductors arranged facing each other across the insulating plate 16 at any place of a channel through which the main currents (ILL, ILH) flow. That is, in the half-bridge power semiconductor module 1, a section, in which the "adjacent antiparallel conduction" of the main current becomes imperfect when the power semiconductor devices (13HT, 13LT) are turned on, is essentially hard to be produced, and thus the parasitic inductance Ls can be reduced.

The high-side power semiconductor device 13HT and the low-side power semiconductor device 13LT are controlled so as to be exclusively turned on. The "adjacent antiparallel conduction" effect can be enhanced in the exclusive turning-on operation, and thus an ideal reduction of the parasitic inductance Ls can be achieved.

The direction of the main current flowing between the high-side terminal 14H to which the exclusively turned-on power semiconductor device (13HT) is connected and the bridge terminal 14B, and the direction of the main current flowing between the low-side terminal 14L to which the exclusively turned-on power semiconductor device (13LT) is connected and the bridge terminal 14B are opposite across the insulating plate 16 of the insulating substrate 15. Accordingly, the "adjacent antiparallel conduction" effect can be enhanced, and thus an ideal reduction of the parasitic inductance Ls can be achieved.

Second Embodiment

The high-side rear surface wiring conductor 17H or low-side rear surface wiring conductor 17L is active when the half-bridge power semiconductor module 1 of FIG. 1(a), FIG. 1(b), and FIG. 1(c) is performing a switching operation. That is, a high voltage is applied to or a high current flows through the rear surface wiring conductors (17H, 17L). Accordingly, the rear surface is preferably deactivated for supporting the half-bridge power semiconductor module 1 when incorporating the half-bridge power semiconductor module 1 into any system. A half-bridge power semiconductor module 2 according to a second embodiment is an example corresponding to this request.

Figure 4:
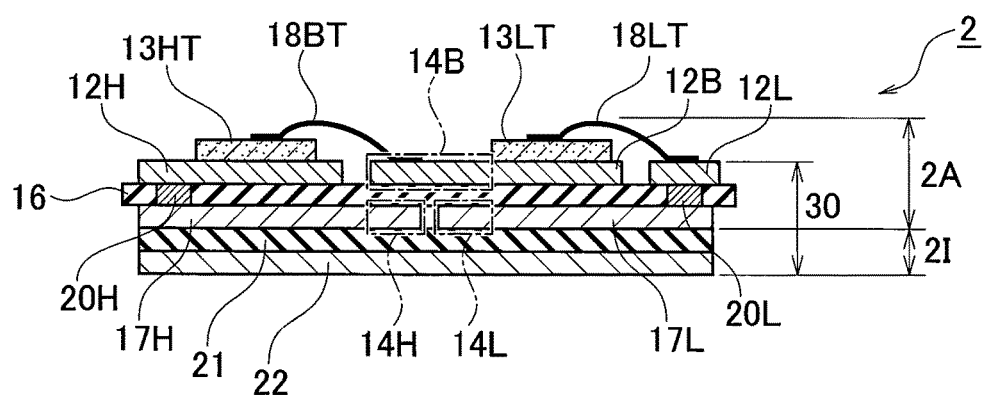
FIG. 4 is a cross-sectional view illustrating the configuration of a half-bridge power semiconductor module 2 according to a second embodiment.

The configuration of the half-bridge power semiconductor module 2 according to the second embodiment will be described with reference to FIG. 4. FIG. 4 is a cross-sectional view of the half-bridge power semiconductor module 2. Note that the planar structure of the half-bridge power semiconductor module 2 is the same as the planar structure of the half-bridge power semiconductor module 1 according to the first embodiment, and thus the description and illustration thereof are omitted. An insulating substrate 30 further includes a second insulating plate 21 arranged on the rear surfaces of the high-side rear surface wiring conductor 17H and low-side rear surface wiring conductor 17L and a solid metal plate 22 arranged on the rear surface of the second insulating plate 21. The second insulating plate 21 is formed of a ceramic plate of, for example, SiN, AlN, alumina, or the like that is directly stuck to the rear surface of the rear surface wiring conductor (17H, 17L). The metal plate 22 is directly stuck to the rear surface of the second insulating plate 21, and has an area slightly smaller than the second insulating plate 21. The metal plate 22 is preferably of a metallic material of the same quality as the surface wiring conductors (12H, 12L, or the like). As described above, the half-bridge power semiconductor module 2 is divided into an active region 2A and an inactive region 2I, and the active region 2A has the configuration identical to the half-bridge power semiconductor module 1 according to the first embodiment.

[Manufacturing Method for Half-Bridge Power Semiconductor Module 2]

Figure 5:
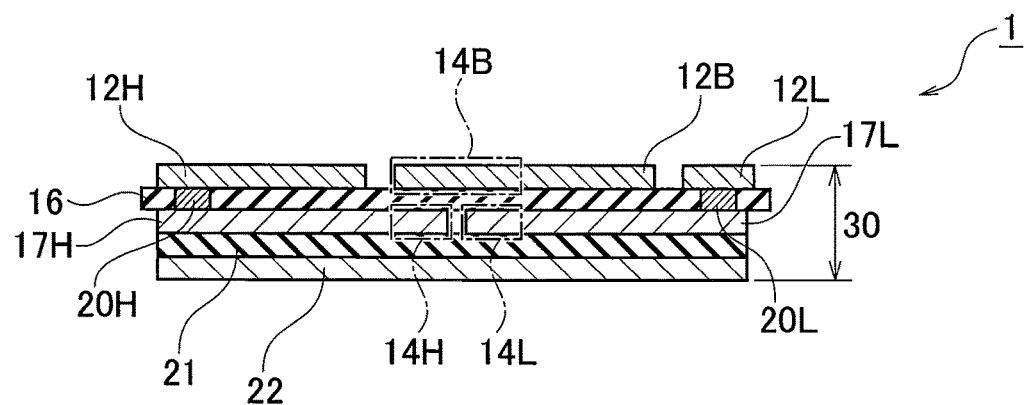
FIG. 5 is a cross-sectional view illustrating the first step according to a manufacturing method for the half-bridge power semiconductor module 2 of FIG. 4.

Next, an example of the manufacturing method for the half-bridge power semiconductor module 2 will be described through the use of FIG. 5.

In the first step, there is prepared the insulating substrate 30 which includes, on the insulating plate 16, the surface wiring conductors (12H, 12L, 12B, 12HG, 12HS, 12LG, 12LS), the rear surface wiring conductors (17H, 17L), each of the terminals (14B, 19HG, 19HS, 19LG, 19LS, 14H, 14L) formed by horizontally extending each of these wiring conductors (12B, 12HG, 12HS, 12LG 12LS, 17H, 17L), and the connection conductors (20H, 20L) and which further includes the second insulating plate 21 and the metal plate 22. At least the surface of the insulating substrate 30 is sufficiently rinsed with an organic solvent such as acetone or ethanol. Note that the description thereof is omitted since the manufacturing method for the insulating substrate 30 of FIG. 5 is already known.

Next, the same steps as the second and third steps described with reference to FIG. 2(b) are performed. Accordingly, the half-bridge power semiconductor module 2 of FIG. 4 is completed.

[Modification (Heat Sink 26)]

Figure 6:
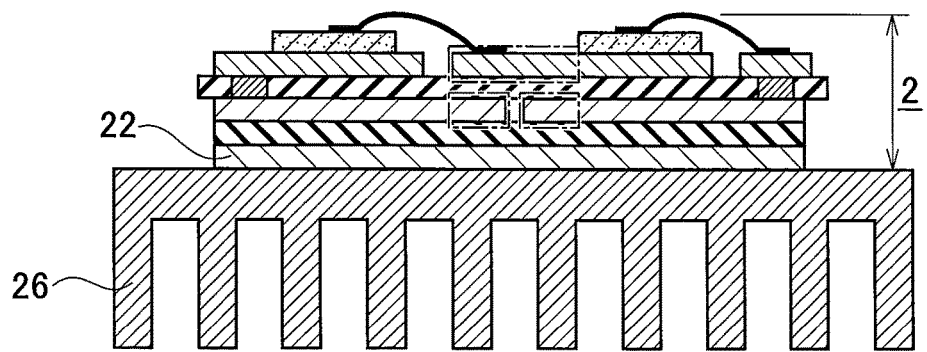
FIG. 6 is a cross-sectional view illustrating a modification in which a heat sink 26 (or radiating plate) is added to the half-bridge power semiconductor module 2 of FIG. 4.

With reference to FIG. 6, a modification will be described in which the heat sink 26 (or radiating plate) is added to the half-bridge power semiconductor module 2 of FIG. 4 as a radiating member. The heat sink 26 thermally makes contact with the rear surface of the half-bridge power semiconductor module 2 to thereby radiate the Joule's heat generated in each of the power semiconductor devices (13HT, 13LT). The heat sink 26 is formed of Al or Cu, and is caused to adhere to the rear surface of the metal plate 22 with a thermally conductive adhesive (not-illustrated) or is bonded with solder or the like. In a case of bonding with a solder, there is used a solder whose solidus temperature is lower, by at least 20° C., than the solidus temperature of the "solder" used in die-bonding of the high-side power semiconductor device 13HT and the low-side power semiconductor device 13LT.

[Working Effect by Second Embodiment]

As illustrated in FIG. 4, the active region 2A of the half-bridge power semiconductor module 2 has the same configuration as the half-bridge power semiconductor module 1. Accordingly, all the working effects by the above-described first embodiment can be exerted.

Since the rear surface of the half-bridge power semiconductor module 2 is deactivated (isolated) by the second insulating plate 21, the design freedom in incorporating the half-bridge power semiconductor module 2 into a system increases.

The symmetry of the coefficient of thermal expansion of the whole insulating substrate 30 can be maintained by provision of the metal plate 22, and there can be suppressed a warpage generated in the insulating substrate 30 when subjected to a cooling/heating cycle. Furthermore, the heat sink 26 or a radiating plate can be directly metal-jointed to the half-bridge power semiconductor module 2 by soldering or the like. Accordingly, the heat conduction between the half-bridge power semiconductor module 2 and the heat sink 26 increases and thus the half-bridge power semiconductor module 2 can exhibit a higher radiation performance.

Third Embodiment

In the first embodiment and second embodiment, there has been illustrated a case where both the high-side power semiconductor device 13HT and the low-side power semiconductor device 13LT are the switching elements, i.e., transistors such as MOSFET or JFET. However, even if either the high-side power semiconductor device or the low-side power semiconductor device is a diode and the other one is a half-bridge power semiconductor module including a transistor, the invention is extremely effective in reduction of the parasitic inductance Ls and consequently in reduction of the surge voltage which is generated when a transistor is turned on. In a third embodiment, there will be described a half-bridge power semiconductor module widely used in a DC-DC converter referred to as a step-down chopper or a step-up chopper, in which either the high-side power semiconductor device or the low-side power semiconductor device is a diode and the other one is a transistor.

The configuration of a half-bridge power semiconductor module 3 used for a step-down chopper will be described with reference to FIG. 7(a) and FIG. 7(b). FIG. 7(a) is a plan view, and FIG. 7(b) is a cross-sectional view along the A-A' cross-section.

The half-bridge power semiconductor module 3 includes an insulating substrate 31. The insulating substrate 31 has the same configuration as the insulating substrate 30 of FIG. 4 except that there is no surface wiring conductors (12LG, 12LS) of FIG. 1(a).

The half-bridge power semiconductor module 3 includes a high-speed recirculating power diode 13LD arranged on the surface of the surface wiring conductor 12B. The high-speed recirculating power diode 13LD is another example of the low-side power semiconductor device, and is formed of s a Schottky diode or a high-speed p-n diode. The rear electrode (cathode electrode) of the high-speed recirculating power diode 13LD is die-bonded to the surface of the surface wiring conductor 12B with solder or the like. On the other hand, the surface electrode (anode electrode) of the high-speed recirculating power diode 13LD is connected to the surface wiring conductor 12L by a plurality of bonding wires 18LD. A bonding ribbon or clip lead may be used in place of the plurality of bonding wires 18LD.

Note that, in the step-down chopper, usually the positive electrode of a DC power supply is connected to the high-side terminal 14H and the negative electrode of the DC power supply is connected to the low-side terminal 14L, and an energy storing coil and smoothing condenser connected in series are connected between the bridge terminal 14B and the low-side terminal 14L. A stepped-down DC voltage is output from both ends of this smoothing condenser.

In the half-bridge power semiconductor module 1 according to the first embodiment, the insulating substrate 15 is replaced with the insulating substrate 31, the low-side power semiconductor device 13LT is replaced with the high-speed recirculating power diode 13LD, the bonding wire 18LT is replaced with the bonding wire 18LD, and the surface wiring conductors (12LG, 12LS), the bonding wires (18LG, 18LS), and the signal terminals (19LG, 19LS) are deleted. Accordingly, the half-bridge power semiconductor module 3 can be manufactured by the same manufacturing process as the manufacturing process of the first embodiment illustrated in FIG. 2(a) and FIG. 2(b).

Note that the heat sink 26 or radiating plate illustrated in FIG. 6 may be applied to the half-bridge power semiconductor module 3 of FIG. 7(a) and FIG. 7(b).

The working effect by the third embodiment will be described. Because the main current ILH (load current) that flows when the high-side power semiconductor device 13H is turned on is the same as that in a case of the half-bridge power semiconductor module 1 according to the first embodiment, the similar effect can be obtained.

According to the third embodiment, in addition to the above-described effect common between the first embodiment and the second embodiment, there can be also obtained an effect of suppressing the ringing phenomenon during the recirculating operation period in which a circulating current flows through the high-speed recirculating power diode 13LD.

More specifically, there is prepared a half-bridge power semiconductor module in which one of the high-side and low-side power semiconductor devices is a diode and the other one is a transistor. Then, the transistor is repeatedly turned on and turned off at high speed to perform a chopping operation. There is often observed a phenomenon called "ringing" in which a stepped recirculating current flows through the diode immediately after turn-off and the recirculating current oscillates. This ringing is a high frequency oscillation, propagates through the power circuit and/or space, and causes various electronic failures, and thus the suppression of the ringing is a critical issue in developing the power converter. One of the main causes of the ringing is the parasitic inductance Ls along a channel through which the recirculating current flows.

The parasitic inductance Ls along a channel through which a recirculating current (ILL') flows will be examined with reference to FIG. 7(a) and FIG. 7(b). The recirculating current (ILL') flows through the high-speed recirculating power diode 13LD when the high-side power semiconductor device 13HT (switch) is turned off. The recirculating current ILL' is input from the low-side terminal 14L, and is output from the bridge terminal 14B through the low-side rear surface wiring conductor 17L, the connection conductor 20L, the surface wiring conductor 12L, the bonding wire 18LD, the high-speed recirculating power diode 13LD, and the surface wiring conductor 12B. When the recirculating current ILL' is flowing, the recirculating current ILL' having the same magnitude and the opposite direction flows on the surfaces facing each other across the insulating plate 16, at substantially all the current channel points (including the low-side terminal 14L and the bridge terminal 14B). Namely, the "adjacent antiparallel conduction" of the recirculating current is realized. Accordingly, an ideal reduction of the parasitic inductance Ls in the channel of the recirculating current ILL' is achieved, and thus the generation of the ringing of the recirculating current can be suppressed.

Fourth Embodiment

Depending on the attribute or application of the half-bridge power semiconductor module, there are cases where a high-speed recirculating power diode FWD (Schottky diode or high-speed p-n diode) is connected in antiparallel to at least one of the high-side and the low-side power semiconductor devices (switches). This case corresponds to, for example, the case of a bipolar power semiconductor device, such as an IGBT, which is theoretically difficult to be reversely conducted, the case of a power semiconductor device (switch) which is unipolar but does not incorporate a reverse-conducting diode, the case where the reverse-conducting diode incorporated in a power semiconductor device (switch) cannot handle current (or it is not desired to be reversely conducted), or the like. In a fourth embodiment, both the high-side power semiconductor device and the low-side power semiconductor device are formed of a pair of each of the power switching elements (13HT, 13LT) and each of the high-speed recirculating power diodes (13HD, 13LD) connected in antiparallel to each other.

Figure 8:
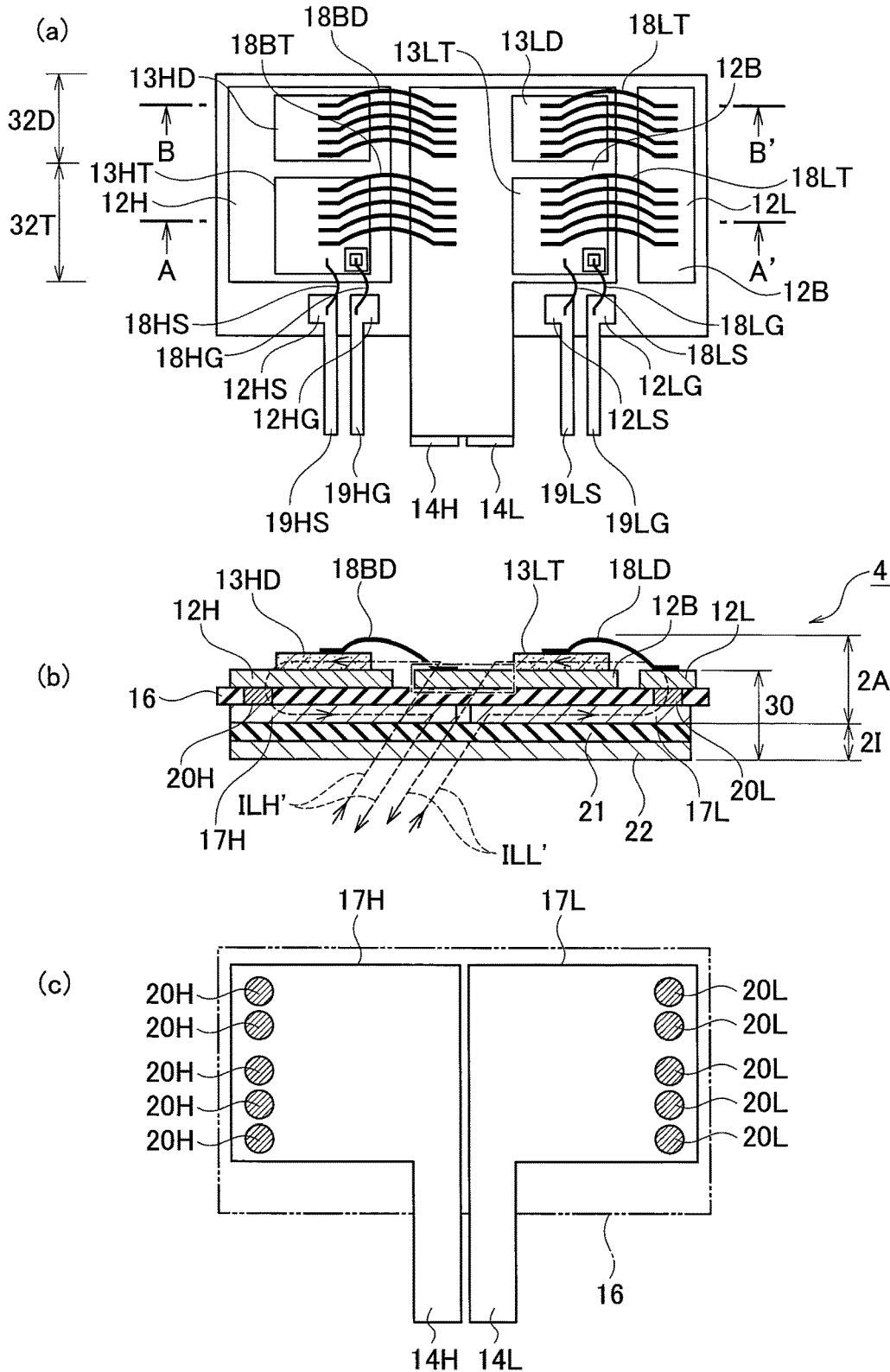
FIG. 8(a) is a plan view illustrating the structure of a half-bridge power semiconductor module 4 according to a fourth embodiment.
FIG. 8(b) is a cross-sectional view along a B-B' cross-section of FIG. 8(a)
FIG. 8(c) is a virtual front view obtained by omitting the insulating plate 16 and the members on the surface side of the insulating plate 16.

The configuration of a half-bridge power semiconductor module 4 will be described with reference to FIG. 8(a), FIG. 8(b), and FIG. 8(c). FIG. 8(a) is a plan view, FIG. 8(b) is a cross-sectional view along the B-B' cross-section, and FIG. 8(c) is a virtual front view obtained by omitting the insulating plate 16 and the members on the surface side of the insulating plate 16 from the front view. Since the cross-sectional view along the A-A' cross-section of FIG. 8(a) is the same as FIG. 4, the illustration thereof is omitted.

A partial region 32T of FIG. 8(a) is the region in which the high-side power semiconductor device 13HT and the low-side power semiconductor device 13LT are disposed, and the structure of the partial region 32T is the same as in the second embodiment (FIG. 4). A partial region 32D of FIG. 8(a) is the region in which the high-speed recirculating power diodes (13HD, 13LD) each of which is formed of a Schottky diode or high-speed p-n diode are arranged on the both sides of the bridge terminal 14B.

A cathode terminal is formed on the rear surface of the high-speed recirculating power diodes (13HD, 13LD) as the rear electrode, while an anode electrode is formed on the surface, as the surface electrode. The rear electrode of the high-speed recirculating power diodes (13HD, 13LD) is die-bonded to the surface wiring conductor 12H or surface wiring conductor 12B, with solder or the like, respectively. The surface electrode of the high-speed recirculating power diodes (13HD, 13LD) is connected to the surface wiring conductor 12H and surface wiring conductor 12B by wedge-bonding wires (18BD, 18LD), respectively. Note that a bonding ribbon or clip lead may be used in place of the bonding wires (18BT, 18LT, 18BD, 18LD).

Since the manufacturing method for the half-bridge power semiconductor module 4 is approximately the same as the manufacturing process of the second embodiment, the description thereof is omitted. However, the die-bonding and wedge bonding of the high-speed recirculating power diodes (13HD, 13LD) are desirably performed in the same step as the power semiconductor devices 13HT, 13LT (switches), respectively.

As a modification, the heat sink 26 can be attached also to the half-bridge power semiconductor module 4 as in FIG. 6.

According to the fourth embodiment, the following working effects can be obtained. Because the structure of the partial region 32T of FIG. 8(a) is the same as the second embodiment (FIG. 4), the same working effect as the second embodiment can be obtained.

Furthermore, an adjacent antiparallel conduction structure for the recirculating current is provided also in the partial region 32D of FIG. 8(a), and thus the ringing phenomenon which occurs when a stepped recirculating current flows can be suppressed.

More specifically, when the low-side power semiconductor device 13LT (switch) is turned off during switching operation, the recirculating current (ILH') illustrated in FIG. 8(b) flows. The recirculating current ILH' is input from the bridge terminal 14B (FIG. 8(a)), and is output from the high-side terminal 14H (FIG. 8(c)) through the bonding wire 18BD, the high-speed recirculating power diode 13HD, the surface wiring conductor 12H, the connection conductor 20H, and the high-side rear surface wiring conductor 17H.

On the other hand, when the high-side power semiconductor device 13HT (switch) is turned off, the recirculating current (ILL') illustrated in FIG. 8(b) flows. The recirculating current ILL' is input from the low-side terminal 14L (FIG. 8(c)), and is output from the bridge terminal 14B (FIG. 8(a)) through the low-side rear surface wiring conductor 17L, the connection conductor 20L, the surface wiring conductor 12L, the bonding wire 18LD, the high-speed recirculating power diode 13LD, and the surface wiring conductor 12B.

As described above, according to the half-bridge power semiconductor module 4, the recirculating currents having the same magnitude and the opposite directions flow on the surfaces facing each other across the insulating plate 16, at substantially all the circulating-current channels, both when the recirculating current ILH' flows and when the recirculating current ILL' flows. Namely, since the adjacent antiparallel conduction is improved, the parasitic inductance Ls of the channel of the recirculating currents (ILH', ILL') which flow when each of the power semiconductor devices (13HT, 13LT) is turned off can be reduced to an ideal level. The generation of the ringing superimposed on the recirculating currents (ILH', ILL') can be suppressed by reduction of this parasitic inductance Ls. The electromagnetic interference induced by the ringing can be also suppressed by suppression of this ringing.

Fifth Embodiment

A fifth embodiment relates to an improvement technique for the fourth embodiment. When the main current (including the circulating current) flows through a flat conductor such as the surface wiring conductor or the rear surface wiring conductor, the main current has a property of uniformly flowing as widely as possible. However, as illustrated in FIG. 21(a) and FIG. 21(c), a conduction medium such as the power semiconductor devices (13HT, 13LT, 13HD, 13LD) or the bonding wires (18BT, 18LT, 18HD, 18LD), which restricts the current width is arranged eccentric from the current gravity center (usually, the center of the wiring conductor) of the rear surface wiring conductors (17H, 17L), when seen from the normal direction of the surface of the insulating plate 16. Accordingly, when seen from the normal direction of the surface of the insulating plate 16, the position of the gravity center of the main current flowing on the surface side of the insulating substrate and the position of the gravity center of the main current flowing in the opposite direction on the rear surface side may not coincide with each other. For example, in the plan view of FIG. 8(a), the current gravity center of the high-side power semiconductor device 13HT is shifted downward from the current gravity center of the high-side rear surface wiring conductor 17H. As described above, in the cross-sectional view of FIG. 8(b), even if the "adjacent antiparallel conduction" is realized between the surface wiring conductor and the rear surface wiring conductor, the effect of reducing the parasitic inductance decreases if the gravity centers (lines) of the main current on the front surface side and the rear surface side are spaced apart from each other, when seen in the plan view. In the fifth embodiment, a half-bridge power semiconductor module 5 solving such a problem will be described.

Figure 9:
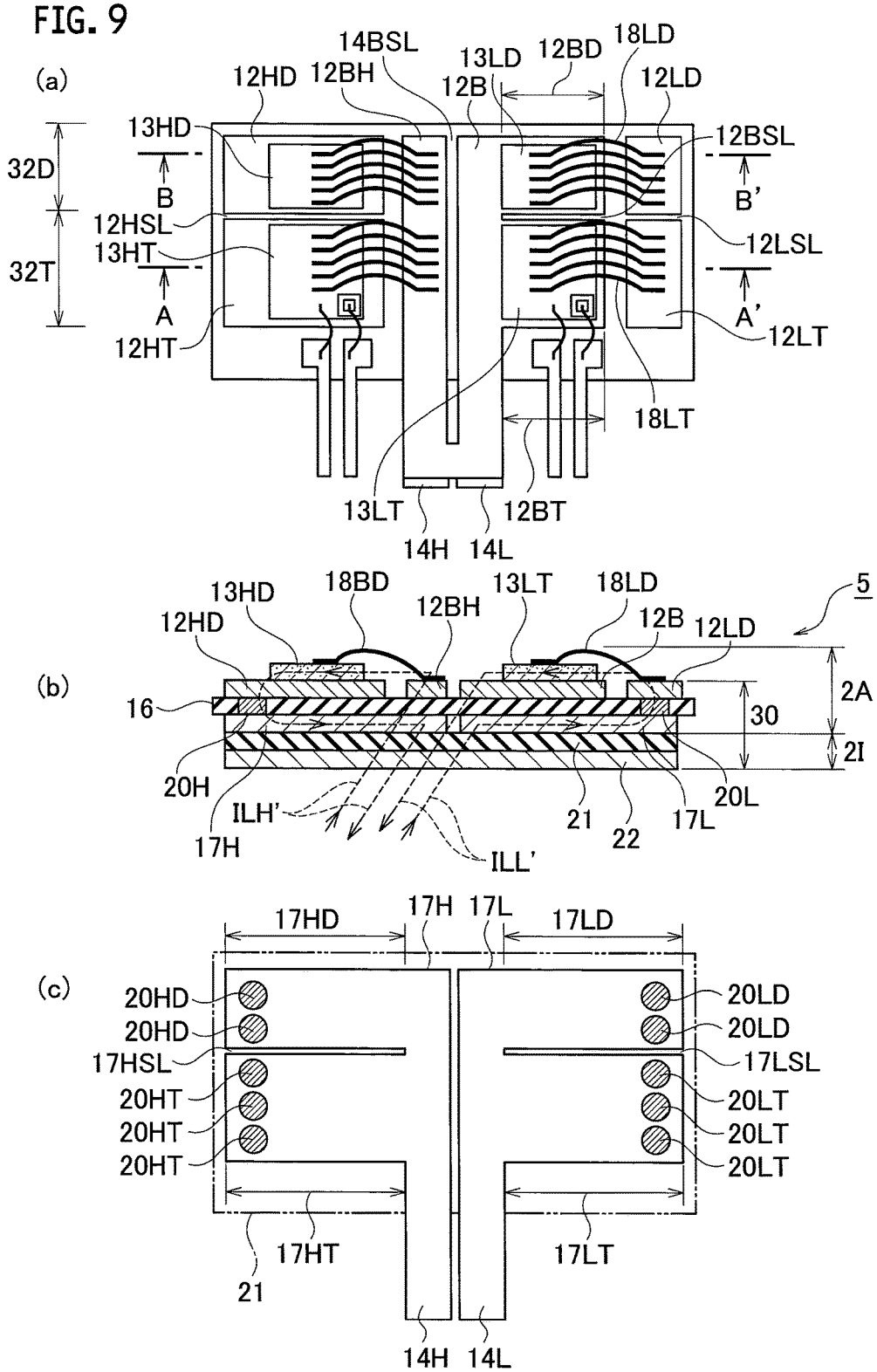
FIG. 9(a) is a plan view illustrating the structure of a half-bridge power semiconductor module 5 according to a fifth embodiment.
FIG. 9(b) is a cross-sectional view along the B-B' cross-section of FIG. 9(a)
FIG. 9(c) is a virtual front view obtained by omitting the insulating plate 16 and the members on the surface side of the insulating plate 16.

The configuration of the half-bridge power semiconductor module 5 will be described with reference to FIG. 9(a), FIG. 9(b), and FIG. 9(c). FIG. 9(a) is a plan view, FIG. 9(b) is a cross-sectional view along the B-B' cross-section, and FIG. 9(c) is a virtual front view obtained by omitting the insulating plate 16 and the member on the front side of the insulating plate 16 from the front view. Since the cross-sectional view along the A-A' cross-section of FIG. 9(a) is the same as FIG. 4, the illustration thereof is omitted.

As illustrated in FIG. 9(a), FIG. 9(b), and FIG. 9(c), a surface wiring conductor 12HT to which the rear electrode of the high-side power semiconductor device 13HT (switch) is connected and a surface wiring conductor 12HD to which the rear electrode of the high-speed recirculating power diode 13HD is connected are partitioned by a slit 12HSL to thereby be electrically insulated from each other. The surface wiring conductor 12HT is connected to a partial region 17HT of the high-side rear surface wiring conductor 17H via a connection conductor 20HT. On the other hand, the surface wiring conductor 12HD is connected to a partial region 17HD of the high-side rear surface wiring conductor 17H via a connection conductor 20HD.

A surface wiring conductor 12LT connected to the surface electrode of the low-side power semiconductor device 13LT (switch) via a bonding wire 18LT and a surface wiring conductor 12LD connected to the surface electrode of the high-speed recirculating power diode 13HD via the bonding wire 18LD are partitioned by a slit 12LSL to thereby be electrically insulated from each other. The surface wiring conductor 12LT is connected to a region 17LT of the low-side rear surface wiring conductor 17L via a connection conductor 20LT. On the other hand, the surface wiring conductor 12LD is connected to a partial region 17LD of the low-side rear surface wiring conductor 17L via a connection conductor 20LD.

As illustrated in FIG. 9(a), the surface wiring conductor 12B is provided with a first slit 12BSL partitioning the low-side power semiconductor device 13LT (switch) and the high-speed recirculating power diode 13LD. The first slit 12BSL electrically isolates a partial region 12BT of the surface wiring conductor 12B from a partial region 12BD of the surface wiring conductor 12B. The low-side power semiconductor device 13LT (switch) is placed in the partial region 12BT, whereas the high-speed recirculating power diode 13LD (diode) is placed in the partial region 12BD. The first slit 12BSL prevents the main current from mixing between the partial region 12BT and the partial region 12BD.

Furthermore, the surface wiring conductor 12B is provided with a second slit 14BSL extending parallel to a direction along which the bridge terminal 14B is extended. The second slit 14BSL separates a bridge connection region 12BH from the surface wiring conductor 12B, and prevents a main current flowing into/out from the high-side side and a main current flowing into/out from the low-side side from mixing in the region of the bridge terminal 14B except for the tip part. The width of the second slit 14BSL substantially coincides with the width of the spacing between the high-side rear surface wiring conductor 17H and the low-side rear surface wiring conductor 17L and coincides with the width of the spacing between the high-side terminal 14H and the low-side terminal 14L, and the second slit 14BSL is provided at the position facing this spacing. Moreover, each of the surface wiring conductor 12B and bridge connection region 12BH separated by the second slit 14BSL faces the high-side rear surface wiring conductor 17H extending toward the high-side terminal 14H and the low-side rear surface wiring conductor 17L extending toward the low-side terminal 14L, respectively.

As illustrated in FIG. 9(c), the low-side rear surface wiring conductor 17L is provided with a slit 17LSL. The slit 17LSL partitions the low-side rear surface wiring conductor 17L into the partial region 17LT (partial region 32T) and the partial region 17LD (partial region 32D) to thereby prevent the main current from mixing between the partial region 17LT and the partial region 17LD. The partial region 17LT is arranged at positions facing the partial region 12BT of the surface wiring conductor 12B and the surface wiring conductor 12LT. The partial region 17LD is arranged at positions facing the partial region 12BD of the surface wiring conductor 12B and the surface wiring conductor 12LD.

The high-side rear surface wiring conductor 17H is provided with a slit 17HSL. The slit 17HSL partitions the high-side rear surface wiring conductor 17H into the partial region 17HT (32T) and the partial region 17HD (32D) to thereby prevent the main current from mixing between the partial region 17HT (32T) and the partial region 17HD (32D). The partial region 17HT is arranged at the position facing the surface wiring conductor 12HT. The partial region 17HD is arranged at the position facing the surface wiring conductor 12HD.

Since the manufacturing method for the half-bridge power semiconductor module 5 is generally the same as the manufacturing process of the second embodiment, the description thereof is omitted. However, the die-bonding and wedge bonding of the high-speed recirculating power diodes (13HD, 13LD) are preferably performed in the same step as the power semiconductor devices 13HT and 13LT (switches), respectively.

As a modification, the heat sink 26 can be attached also to the half-bridge power semiconductor module 5 as in FIG. 6.

According to the fifth embodiment, the following working effects can be obtained. Since the A-A' cross-sectional structure and B-B' cross-sectional structure of FIG. 9(a) are the same as those in the fourth embodiment, the same working effects as those in the fourth embodiment can be obtained.

Furthermore, in the fifth embodiment, when seen from the normal direction of the surface of the insulating plate 16, a current gravity center line of the main current flowing through the surface wiring conductor coincides with a current gravity center line of the main current flowing in the opposite direction through the rear surface wiring conductor. Accordingly, the reduction in a further more ideal parasitic inductance can be obtained as compared with that in the fourth embodiment.

More specifically, there is considered the flow of the main current when the high-side power semiconductor device 13HT (switch) is turned on during switching operation. FIG. 10(*a*) and FIG. 10(*b*) illustrate a current gravity center line ILHC of the main current in the fourth embodiment, while FIG. 11(*a*) and FIG. 11(*b*) illustrate a current gravity center line ILHC' of the main current in the fifth embodiment. The current gravity center line on the rear surface wiring conductor side is indicated by a solid line, while the current gravity center line of the surface wiring conductor, the power semiconductor device, and the bonding wire is indicated by a dashed line. The arrow indicates the direction of the main current.

First, attention is paid to a region 23HT near the power semiconductor device and the bonding wire. In FIG. 10(*a*) and FIG. 10(*b*), the width (in the vertical direction on the plane of the drawing) of each of the power semiconductor device 13HT and bonding wire 18BT is narrower than the width (in the vertical direction on the plane of the drawing) of the high-side rear surface wiring conductor 17H, and the power semiconductor device 13HT and bonding wire 18BT are eccentrically located downward relative to the high-side rear surface wiring conductor 17H. Accordingly, as illustrated in FIG. 10(*a*) and FIG. 10(*b*), the current gravity center line ILHC (dashed line) of the main current flowing on the surface side and the current gravity center line ILHC (solid line) of the main current flowing in the opposite direction on the rear surface side are spaced apart from each other. Therefore, the effect of reducing the parasitic inductance in this portion decreases more than an ideal effect.

However, in the fifth embodiment, the surface wiring conductor 12H is divided into the surface wiring conductor 12HT (32T) and the surface wiring conductor 12HD (32D) by the slit 12HSL. The power semiconductor device 13HT (switch) is mounted on the surface wiring conductor 12HT. The high-side rear surface wiring conductor 17H facing the surface wiring conductor 12HT is divided into the partial region 17HT and the partial region 17HD by the slit 17HSL. A collection region including the surface wiring conductor 12HT, power semiconductor device 13HT (switch), and bonding wire 18BT on the surface side and the partial region 17HT on the rear surface side are arranged so as to face each other. Accordingly, as illustrated in FIG. 11(*a*) and FIG. 11(*b*), when seen from the normal direction of the surface of the insulating plate 16, the current gravity center line ILHC' of the main current flowing on the surface side coincides with the current gravity center line ILHC' of the main current flowing in the opposite direction on the rear surface side. Therefore, an ideal effect of reducing the parasitic inductance can be achieved in the relevant region.

Next, attention is paid to a region (partial region 24BH) near the bridge connection region of the surface wiring conductor 12B and a lead extracting portion. In the fourth embodiment, the width of the high-side terminal 14H is narrower than the bridge terminal 14B, and the high-side terminal 14H is eccentrically located on one side (left side) of the bridge terminal 14B. Accordingly, as illustrated in FIG. 10(*a*) and FIG. 10(*b*), the current gravity center line ILHC (solid line) of the main current flowing into the rear surface side deviates to one side (left side) from the current gravity center line ILHC (dashed line) of the main current flowing out of the surface side. Therefore, the effect of reducing the parasitic inductance in this portion decreases more than an ideal effect.

In contrast, in the fifth embodiment, the bridge connection region 12BH is separated from the surface wiring conductor 12B by the slit 14BSL, and the bridge connection region 12BH faces the high-side terminal 14H. Accordingly, as illustrated in FIG. 11(*a*) and FIG. 11(*b*), the current gravity center line ILHC' (solid line) of the main current flowing on the rear surface side coincides with the current gravity center line ILHC' (dashed line) of the main current flowing in the opposite direction on the surface side, and thus an ideal effect of reducing the inductance can be achieved in the relevant region.

FIG. 12(*a*) and FIG. 12(*b*) illustrate the current gravity center line (ILLC) of the main current which flows when the low-side power semiconductor device 13LT (switch) is turned on, in the fourth embodiment. FIG. 13(*a*) and FIG. 13(*b*) illustrate the current gravity center line (ILLC') of the main current which flows when the low-side power semiconductor device 13LT (switch) is turned on, in the fifth embodiment. FIG. 14(*a*) and FIG. 14(*b*) illustrate the current gravity center line (ILHC) of the recirculating current flowing through the high-side power semiconductor device 13HD (diode), in the fourth embodiment. FIG. 15(*a*) and FIG. 15(*b*) illustrate the current gravity center line (ILHC') of the recirculating current flowing through the high-side power semiconductor device 13HD (diode), in the fifth embodiment. FIG. 16(*a*) and FIG. 16(*b*) illustrate the current gravity center line (ILLC) of the recirculating current flowing through the low-side power semiconductor device 13LD (diode), in the fourth embodiment. FIG. 17(*a*) and FIG. 17(*b*) illustrate the current gravity center line (ILLC') of the recirculating current flowing through the low-side power semiconductor device 13LD (diode), in the fifth embodiment.

As illustrated in FIG. 12(*a*), FIG. 12(*b*), FIG. 14(*a*), FIG. 14(*b*), FIG. 16(*a*), and FIG. 16(*b*), the current gravity center lines (ILLC, ILHC) of the current flowing through the half-bridge power semiconductor module 4 of the fourth embodiment are spaced apart between on the surface side and on the rear surface side, when seen from the normal direction of the surface of the insulating plate 16. Therefore, the effect of reducing the parasitic inductance decreases more than an ideal effect. On the other hand, as illustrated in FIG. 13(*a*), FIG. 13(*b*), FIG. 15(*a*), FIG. 15(*b*), FIG. 17(*a*), and FIG. 17(*b*), the current gravity center lines (ILLC', ILHC') of the current flowing through the half-bridge power semiconductor module 5 of the fifth embodiment coincide with each other on the surface side and on the rear surface side. Therefore, an ideal effect of reducing the parasitic inductance can be achieved.

Note that, in the partial region 24BH (near the bridge connection region and the lead extraction) of FIG. 10(*a*), FIG. 10(*b*), FIG. 12(*a*), FIG. 12(*b*), FIG. 14(*a*), FIG. 14(*b*), FIG. 16(*a*), and FIG. 16(*b*), the problem that "the current gravity center line of the main current flowing on the surface side and the current gravity center line of the main current flowing in the opposite direction on the rear surface side are spaced apart from each other in the longitudinal direction of the insulating plate 16" is common to not only the fourth embodiment but the first to third embodiments. In order to solve this problem, the bridge connection region 12BH may be separated from the surface wiring conductor 12B by provision of the slit 14BSL in the surface wiring conductor 12B as illustrated in the fifth embodiment. Accordingly, the main current can be fed only through the bridge connection region 12BH facing the high-side terminal 14H, and thus the current gravity centers on the surface side and on the rear surface side can be caused to coincide with each other. As one example, FIG. 18(a) and FIG. 18(b) illustrate a half-bridge power semiconductor module 6 having a slit 14BSL provided in the surface wiring conductor 12B of the half-bridge power semiconductor module 3 (FIG. 7(a), FIG. 7(b)) of the third embodiment. Similarly, the slit 14BSL may be provided in the surface wiring conductor 12B of the half-bridge power semiconductor module 1 illustrated in FIG. 1(a), FIG. 1(b), and FIG. 1(c), and in the surface wiring conductor 12B of the half-bridge power semiconductor module 2 illustrated in FIG. 4.

Sixth Embodiment

In the first to fifth embodiments, the extracting direction of each terminal (the bridge terminal 14B, the high-side terminal 14H, the low-side terminal 14L) is perpendicular to the direction through which the main current flows in the half-bridge power semiconductor module. In a sixth embodiment, there will be described a layout example in which the extracting direction of each of the terminals (14B, 14H, 14L) is substantially parallel to the direction through which the main current flows in the half-bridge power semiconductor module.

The half-bridge power semiconductor module includes: the insulating substrates 15, 30 having a stacked structure; the high-side power semiconductor device 13HT (switch) and low-side power semiconductor device 13LT (switch) arranged spaced apart from each other on the surface of the insulating substrate; the bridge terminal 14B; the high-side terminal 14H; the low-side terminal 14L; the plurality of bonding wires 18BT; and the plurality of bonding wires 18LT.

The insulating substrate 15 includes: the insulating plate 16; the surface wiring conductors 12H, 12L, 12B, 12HG, 12HS, 12LG, 12LS; the high-side rear surface wiring conductor 17H; the low-side rear surface wiring conductor 17L; the second insulating plate 21; and the metal plate 22.

The insulating substrate 15 further includes the connection conductors (20H, 20L) embedded into a plurality of opening windows provided in the insulating plate 16. The connection conductor 20H connects the surface wiring conductor 12H (the first surface-wiring conductor) and the high-side rear surface wiring conductors 17H. The connection conductor 20L connects between the surface wiring conductor 12L and the low-side rear surface wiring conductors 17L. The connection conductor 20H is arranged in the orientation opposite to the orientation of the bridge terminal 14B, when seen from the high-side power semiconductor device 13HT (switch). The connection conductor 20L is arranged in the orientation opposite to the orientation of the bridge terminal 14B, when seen from the low-side power semiconductor device 13LT (switch).

The low-side power semiconductor device 13LT has the rear electrode thereof connected onto the surface wiring conductor 12B (the second surface-wiring conductor). The surface electrode of the low-side power semiconductor device 13LT is connected to the surface wiring conductor 12L via the plurality of bonding wires 18LT.

The high-side power semiconductor device 13HT has the rear electrode connected onto the surface wiring conductor 12H. The surface electrode of the high-side power semiconductor device 13HT is connected to the surface wiring conductor 24B via the plurality of bonding wires 18BT. The surface wiring conductor 24B is formed integrally with the surface wiring conductor 12B via the bridge terminal.

The plurality of bonding wires 18LT, surface wiring conductor 12L, and connection conductor 20L correspond to the "second connection portion". The plurality of bonding wires 18LT, the surface wiring conductor 12L, and the connection conductor 20L are provided toward the orientation opposite to the orientation toward the bridge terminal 14B, when seen from the low-side power semiconductor device 13LT, and connect the surface electrode of the low-side power semiconductor device 13LT and the low-side rear surface wiring conductors 17L.

The connection conductor 20H corresponds to the "first connection portion". The connection conductor 20H is provided in an orientation opposite to the orientation toward the bridge terminal 14B, when seen from the high-side power semiconductor device 13HT, and connects the surface wiring conductor 12H (first surface-wiring conductor) and the high-side rear surface wiring conductor 17H.

The bridge terminal 14B is the terminal extended from the surface wiring conductor 12B and surface wiring conductor 24B. Specifically, the bridge terminal 14B is formed by being extended in a direction parallel to the surface of the insulating substrate from the surface wiring conductors (12B, 24B).

The high-side terminal 14H is formed by extending the high-side rear surface wiring conductor 17H. The high-side terminal 14H is extended so as to overlap with the bridge terminal 14B in the same orientation as the bridge terminals 14B, when seen from the normal direction of the insulating substrate.

The low-side terminal 14L is formed by extending the low-side rear surface wiring conductor 17L. The low-side terminal 14L is extended so as to overlap with the bridge terminal 14B in the same orientation as the bridge terminal 14B, when seen from the normal direction of the insulating substrate.

In the sixth embodiment, each of the high-side power semiconductor device 13HT and the low-side power semiconductor device 13LT is a power switching element. The gate electrode and surface electrode of the high-side power semiconductor device 13HT are connected to the surface wiring conductor 12HG or 12HS via the bonding wire 18HG or 18HS, respectively. The gate electrode and surface electrode of the low-side power semiconductor device 13LT are connected to the surface wiring conductor 12LG or 12LS via the bonding wire 18LG or 18LS, respectively. Parts of the surface wiring conductors 12HG and 12HS are extended, in the shape of a strip and adjacently parallel to each other, toward the outside of the insulating substrate 15, thereby forming the gate signal terminal 19HG or the source signal terminal 19HS, respectively. Parts of the surface wiring conductors 12LG and 12LS are extended, in the shape of a strip and adjacently parallel to each other, toward the outside of the insulating substrate 15, thereby forming the gate signal terminal 19LG or the source signal terminal 19LS, respectively.

Note that, in the sixth embodiment, it is assumed that the high-side power semiconductor device 13HT and the low-side power semiconductor device 13LT are controlled so as to be exclusively turned on. It is possible to simultaneously turn on (ground) the high-side power semiconductor device 13HT and the low-side power semiconductor device 13LT.

The bridge terminal 14B, high-side terminal 14H, low-side terminal 14L, gate signal terminals (19HG 19LG), and source signal terminals (19HS, 19LS) are formed by extending each of the surface wiring conductor and rear surface wiring conductor. Accordingly, each terminal is integral to each of the surface wiring conductor and rear surface wiring conductor, and naturally, the material thereof is the same as the surface wiring conductor or the rear surface wiring conductor.

The main current flowing through the low-side power semiconductor device 13LT is input to the module from the bridge terminal 14B of the surface, and is output to the outside of the module from the low-side terminal 14L of the rear surface through the surface wiring conductor 12B, the low-side power semiconductor device 13LT, the bonding wire 18LT, the surface wiring conductor 12L, the connection conductor 20L, and the low-side rear surface wiring conductor 17L.

As described above, when the low-side power semiconductor device 13L is turned on, the main current having the same magnitude and opposite direction can be fed on the surface side and rear surface side of the insulating substrate 15, respectively, at substantially all the places (including also the bridge terminal 14B and low-side terminal 14L) through which the main current (load current) flows. Accordingly, the "adjacent antiparallel conduction" effect of the main current can be obtained in the whole region, and thus the parasitic inductance Ls produced in a current channel when the low-side power semiconductor device 13LT is turned on can be ideally reduced.

On the other hand, the main current flowing through the high-side power semiconductor device 13HT is input to the module from the high-side terminal 14H of the rear surface, and is output to the outside of the module from the bridge terminal 14B of the surface through the high-side rear surface wiring conductor 17H, the connection conductor 20H, the surface wiring conductor 12H, the high-side power semiconductor device 13HT, the bonding wire 18BT, and the surface wiring conductor 24B.

As described above, when the high-side power semiconductor device 13HT is also turned on, the main current having the same magnitude and opposite direction can be caused to flow on the surface side and rear surface side of the insulating substrate 15, respectively, at substantially all the places (including also the bridge terminal 14B and low-side terminal 14L) through which the main current (load current) flows. Accordingly, the "adjacent antiparallel conduction" effect of the main current can be obtained in the whole region, and thus the parasitic inductance Ls produced in a current channel when the high-side power semiconductor device 13HT is turned on can be ideally reduced.

As described above, even if each of the extracting directions of the bridge terminal 14B, high-side terminal 14H, and low-side terminal 14L is parallel to the direction through which the main current flows in the half-bridge power semiconductor module, the "adjacent antiparallel conduction" effect of the main current can be obtained as with the other embodiments.

The embodiments described above are illustrative only and described for ease of understanding of the present invention, and the present invention is not limited to these embodiments. The technical scope of the present invention includes not only the specific technical items disclosed in the above-described embodiment but also various modifications, changes, alternative techniques and the like that may be easily derived therefrom.

This application is based upon and claims the benefit of priority from Japanese Patent Application No. 2014-137589, filed on Jul. 3, 2014, the entire content of which are incorporated herein by reference.

INDUSTRIAL APPLICABILITY

According to the half-bridge power semiconductor module and manufacturing method therefor of the present invention, the parasitic inductance inside a module can be reduced by improvement of the adjacent antiparallel conduction of the main current.

REFERENCE SIGNS LIST 1, 2, 3, 4, 5, 6 half-bridge power semiconductor module
12H, 12L, 12B, 12HG, 12HS, 12LG, 12LS, 12HD, 12HT, 12LD surface wiring conductor
13HT high-side power semiconductor device (switch)
13HD high-side power semiconductor device (diode)
13LT low-side power semiconductor device (switch)
13LD high-side power semiconductor device (diode)
14H high-side terminal
14L low-side terminal
14B bridge terminal
15, 30, 31 insulating substrate
16 insulating plate
17H high-side rear surface wiring conductor
17L low-side rear surface wiring conductor
18BT, 18LT, 18BD, 18LD bonding wire
20H, 20L connection conductor
21 second insulating plate
22 metal plate
26 heat sink
ILHC, ILHC', ILLC, ILLC' current gravity center line

The invention claimed is:
1. A half-bridge power semiconductor module comprising:
an insulating substrate including an insulating plate, a plurality of surface wiring conductors arranged on a surface of the insulating plate, and a high-side rear surface wiring conductor and a low-side rear surface wiring conductor arranged on a rear surface of the insulating plate;
a low-side power semiconductor device having a rear electrode thereof ohmically connected onto a second surface-wiring conductor selected from among the plurality of surface wiring conductors;
a high-side power semiconductor device having a rear electrode ohmically connected onto a first surface-wiring conductor selected from among the plurality of surface wiring conductors, and having a surface electrode thereof ohmically connected to the second surface-wiring conductor;
a bridge terminal extending from the first surface-wiring conductor at a position between the high-side power semiconductor device and the low-side power semiconductor device;
a first connection portion which is arranged on an opposite side from the low-side power semiconductor device relative to the high-side power semiconductor device in a plan view of the half-bridge power semiconductor module, and which ohmically connects the first surface-wiring conductor and the high-side rear surface wiring conductor;
a second connection portion which is arranged entirely on an opposite side from the high-side power semiconductor device relative to the low-side power semiconductor device in a plan view of the half-bridge power semiconductor module, and which ohmically connects a surface electrode of the low-side power semiconductor device and the low-side rear surface wiring conductor;
a high-side terminal which extends from the high-side rear surface wiring conductor at a position between the high-side power semiconductor device and the low-side power semiconductor device, and through which current flows from a positive electrode of a power supply; and
a low-side terminal which extends from the low-side rear surface wiring conductor at a position between the high-side power semiconductor device and the low-side power semiconductor device, and through which current flows to a negative electrode of the power supply.

2. The half-bridge power semiconductor module according to claim 1, wherein
a direction of a main current flowing between the high-side terminal and the bridge terminal via the high-side power semiconductor device and a direction of a main current flowing between the low-side terminal and the bridge terminal via the low-side power semiconductor device are opposite to each other across the insulating plate.

3. The half-bridge power semiconductor module according to claim 1, wherein
among the main currents flowing via the high-side power semiconductor device, a current gravity center line of a main current flowing on a surface side of the insulating plate coincides with a current gravity center line of a main current flowing on a rear surface side of the insulating plate, when seen from a normal direction of the insulating plate.

4. The half-bridge power semiconductor module according to claim 1, wherein
among the main currents flowing via the low-side power semiconductor device, a current gravity center line of a main current flowing on a surface side of the insulating plate coincides with a current gravity center line of a main current flowing on a rear surface side of the insulating plate, when seen from a normal direction of the insulating plate.

5. The half-bridge power semiconductor module according to claim 1, wherein
the high-side power semiconductor device and the low-side power semiconductor device are controlled so as to be exclusively turned on.

6. The half-bridge power semiconductor module according to claim 1, wherein
any one of the high-side power semiconductor device and the low-side power semiconductor device is a power switching element, and the other one is a power diode.

7. The half-bridge power semiconductor module according to claim 1, wherein
any one of or both of the high-side power semiconductor device and the low-side power semiconductor device includes or include a pair of a power switching element and high-speed recirculating power diode connected in parallel to each other.

8. The half-bridge power semiconductor module according to claim 7, wherein
when one of the high-side power semiconductor device and the low-side power semiconductor device is turned off, a direction of a circulating current flowing via the high-speed recirculating power diode of the other one or via a diode built in the power switching element is opposite across the insulating plate.

9. The half-bridge power semiconductor module according to claim 1, wherein
the insulating substrate further includes:
a second insulating plate arranged on a rear surfaces of the high-side rear surface wiring conductor and the low-side rear surface wiring conductor; and
a metal plate arranged on the rear surface of the second insulating plate.

10. A manufacturing method for a half-bridge power semiconductor module, the module including:
an insulating substrate including an insulating plate, a plurality of surface wiring conductors arranged on a surface of the insulating plate, and a high-side rear surface wiring conductor and a low-side rear surface wiring conductor arranged on a rear surface of the insulating plate;
a low-side power semiconductor device having a rear electrode thereof ohmically connected onto a second surface-wiring conductor selected from among the plurality of surface wiring conductors;
a high-side power semiconductor device having a rear electrode ohmically connected onto a first surface-wiring conductor selected from among the plurality of surface wiring conductors, and having a surface electrode thereof ohmically connected to the second surface-wiring conductor;
a bridge terminal extending from the first surface-wiring conductor at a position between the high-side power semiconductor device and the low-side power semiconductor device;
a first connection portion which is arranged on an opposite side from the low-side power semiconductor device relative to the high-side power semiconductor device in a plan view of the half-bridge power semiconductor module, and which ohmically connects the first surface-wiring conductor and the high-side rear surface wiring conductor;
a second connection portion which is arranged entirely on an opposite side from the high-side power semiconductor device relative to the low-side power semiconductor device in a plan view of the half-bridge power semiconductor module, and which ohmically connects a surface electrode of the low-side power semiconductor device and the low-side rear surface wiring conductor;
a high-side terminal which extends from the high-side rear surface wiring conductor at a position between the high-side power semiconductor device and the low-side power semiconductor device, and through which current flows from a positive electrode of a power supply; and
a low-side terminal which extends from the low-side rear surface wiring conductor at a position between the high-side power semiconductor device and the low-side power semiconductor device, and through which current flows to a negative electrode of the power supply, the method comprising the steps of:
preparing the insulating substrate;

adhering the high-side power semiconductor device and the low-side power semiconductor device onto the first surface-wiring conductor and the second surface-wiring conductor, respectively;

ohmically connecting the surface electrode of the high-side power semiconductor device and the second surface-wiring conductor; and ohmically connecting the surface electrode of the low-side power semiconductor device and the low-side rear surface wiring conductor.

* * * * *